(12) United States Patent
Kusumoto et al.

(10) Patent No.: US 9,543,858 B2
(45) Date of Patent: Jan. 10, 2017

(54) SEMICONDUCTOR DEVICE AND INVERTER USING SAME

(71) Applicant: Panasonic Intellectual Property Management Co., Ltd., Osaka (JP)

(72) Inventors: Osamu Kusumoto, Nara (JP); Hideki Nakata, Osaka (JP); Keiji Akamatsu, Hyogo (JP); Masao Uchida, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/440,341

(22) PCT Filed: Jul. 4, 2014

(86) PCT No.: PCT/JP2014/003561
§ 371 (c)(1),
(2) Date: May 1, 2015

(87) PCT Pub. No.: WO2015/004891
PCT Pub. Date: Jan. 15, 2015

(65) Prior Publication Data
US 2015/0280611 A1     Oct. 1, 2015

(30) Foreign Application Priority Data

Jul. 10, 2013  (JP) ................. 2013-144245

(51) Int. Cl.
*H01L 27/02*   (2006.01)
*H01L 27/112*  (2006.01)
(Continued)

(52) U.S. Cl.
CPC ............ *H02M 7/5387* (2013.01); *H01L 21/76* (2013.01); *H01L 21/8213* (2013.01);
(Continued)

(58) Field of Classification Search
CPC ............ H02M 7/5387; H02M 7/53871; H02M 7/53875; H02M 1/32; H01L 21/8213; H01L 29/7815
(Continued)

(56) References Cited

U.S. PATENT DOCUMENTS 5,631,813 A * 5/1997 Ikeshita ............. H02M 5/4585
                                                          318/377
6,181,576 B1 * 1/2001 Ikeda ................... B23K 9/1043
                                                          363/17
(Continued)

FOREIGN PATENT DOCUMENTS

CN      1195893 A      10/1998
EP   0 862 224 A1      9/1998
(Continued)

OTHER PUBLICATIONS

International Search Report for corresponding International Application No. PCT/JP2014/003561 mailed Oct. 7, 2014.
(Continued)

*Primary Examiner* — Timothy J Dole
*Assistant Examiner* — Sisay G Tiku
(74) *Attorney, Agent, or Firm* — Renner, Otto, Boisselle & Sklar, LLP

(57) ABSTRACT

A semiconductor device includes a gate pad, a first source pad and a second source pad insulated from each other, a drain pad, a main region, and a sense region for detecting a forward current and a reverse current. The main region and the sense region each include a plurality of unit cells which are in parallel connection, the number of unit cells in the sense region being smaller than the number of unit cells in the main region. A source electrode of any unit cell in the (Continued)

main region is connected to the first source pad, and a source electrode of any unit cell in the sense region is connected to the second source pad.

19 Claims, 25 Drawing Sheets

(51) Int. Cl.
H01L 29/74 (2006.01)
H01L 29/06 (2006.01)
H02M 7/5387 (2007.01)
H01L 21/76 (2006.01)
H02M 1/08 (2006.01)
H02M 1/32 (2007.01)
H02M 7/00 (2006.01)
H02M 7/797 (2006.01)
H01L 21/82 (2006.01)
H01L 29/10 (2006.01)
H01L 29/16 (2006.01)
H01L 29/78 (2006.01)
H02M 1/00 (2006.01)

(52) U.S. Cl.
CPC ...... H01L 29/0642 (2013.01); H01L 29/0696 (2013.01); H01L 29/1095 (2013.01); H01L 29/1608 (2013.01); H01L 29/7802 (2013.01); H01L 29/7827 (2013.01); H02M 1/08 (2013.01); H02M 1/32 (2013.01); H02M 7/003 (2013.01); H02M 7/797 (2013.01); H02M 2001/0009 (2013.01)

(58) Field of Classification Search
USPC ............... 257/202, 205, 206, 367, 401, 390, 372,257/341, 342; 438/128, 129, 135, 140, 138, 438/186, 188, 192
See application file for complete search history.

(56) References Cited

U.S. PATENT DOCUMENTS

| | | | |
|---|---|---|---|
| 6,459,380 B1 | 10/2002 | Watanabe et al. | |
| 7,471,525 B2* | 12/2008 | Suzuki | H02M 5/4585 363/34 |
| 8,644,038 B2* | 2/2014 | Sasaki | G01R 19/0092 361/93.2 |
| 8,659,864 B2* | 2/2014 | Uemura | G01R 19/0092 323/315 |
| 9,300,130 B2* | 3/2016 | Tsunekawa | H02H 3/20 |
| 2001/0037801 A1* | 11/2001 | Ito | F02P 3/04 123/644 |
| 2005/0206438 A1* | 9/2005 | Higashi | H03K 17/166 327/427 |
| 2007/0058404 A1* | 3/2007 | Yaguchi | H02M 1/36 363/132 |
| 2007/0200521 A1* | 8/2007 | Ochiai | B60L 3/003 318/376 |
| 2008/0100978 A1* | 5/2008 | Maebara | H03K 17/0828 361/93.8 |
| 2008/0198526 A1* | 8/2008 | Hiyama | H03K 17/0828 361/93.7 |
| 2009/0057832 A1* | 3/2009 | Kouno | H01L 29/7397 257/577 |
| 2009/0200969 A1* | 8/2009 | Nagataki | H02P 3/18 318/380 |
| 2010/0156506 A1 | 6/2010 | Tsuzuki et al. | |
| 2011/0227069 A1 | 9/2011 | Hashimoto | |
| 2011/0297934 A1 | 12/2011 | Soeno | |
| 2012/0056242 A1 | 3/2012 | Tsuzuki et al. | |
| 2012/0057386 A1 | 3/2012 | Adachi et al. | |
| 2012/0126791 A1* | 5/2012 | Nakatake | H03K 17/0822 324/123 R |
| 2012/0132912 A1 | 5/2012 | Suekawa et al. | |
| 2013/0043468 A1* | 2/2013 | Adekore | H01L 29/267 257/43 |
| 2013/0153900 A1* | 6/2013 | Kinouchi | G01K 7/01 257/48 |
| 2014/0152214 A1* | 6/2014 | Furukawa | B60L 15/025 318/400.13 |
| 2014/0203740 A1* | 7/2014 | Ogawa | H02P 3/22 318/375 |
| 2015/0236012 A1* | 8/2015 | Hino | H01L 27/0629 257/77 |

FOREIGN PATENT DOCUMENTS

| | | |
|---|---|---|
| JP | 02-237472 A | 9/1990 |
| JP | 06-014561 A | 1/1994 |
| JP | 07-284295 A | 10/1995 |
| JP | 2000-341960 A | 12/2000 |
| JP | 2003-243656 A | 8/2003 |
| JP | 2004-088001 A | 3/2004 |
| JP | 2005-050913 A | 2/2005 |
| JP | 2007-014059 A | 1/2007 |
| JP | 2009-099690 A | 5/2009 |
| JP | 2010-171385 A | 8/2010 |
| JP | 2010-192565 A | 9/2010 |
| JP | 2011-198891 A | 10/2011 |
| JP | 2012-129503 A | 7/2012 |
| JP | 2012-156564 A | 8/2012 |
| WO | WO 2010/125819 A1 | 11/2010 |
| WO | WO 2011/048845 A1 | 4/2011 |

OTHER PUBLICATIONS

IEDM11-602, 2011 IEEE International Electron Devices Meeting (IEDM 2011) Washington, DC, USA Dec. 5-7, 2011, IEEE Catalog No. CFP11IED-PRT; ISBN: 978-1-4577-0506-9.

Chinese Office Action and Search Report with English translation dated Nov. 2, 2016 for corresponding Chinese Application No. 201480002917.3.

* cited by examiner

FIG.2
(a)
(b)
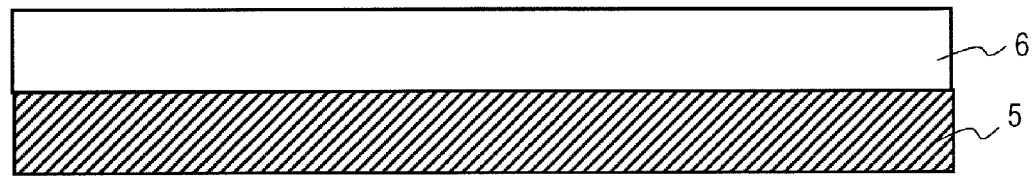
(c)
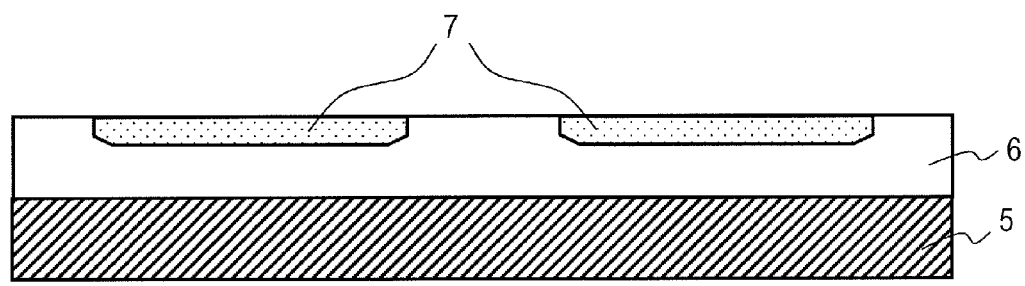
(d)
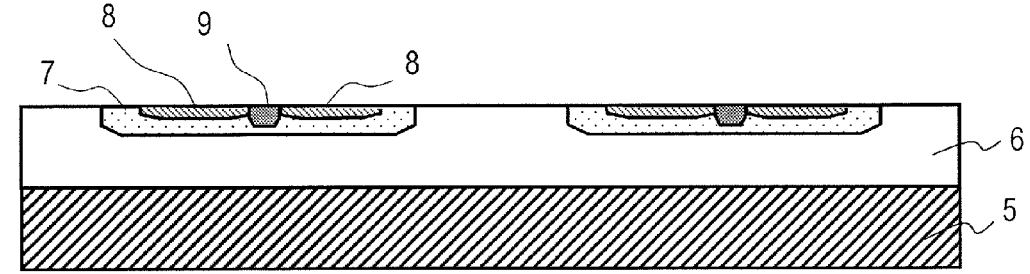

FIG. 3
(a) 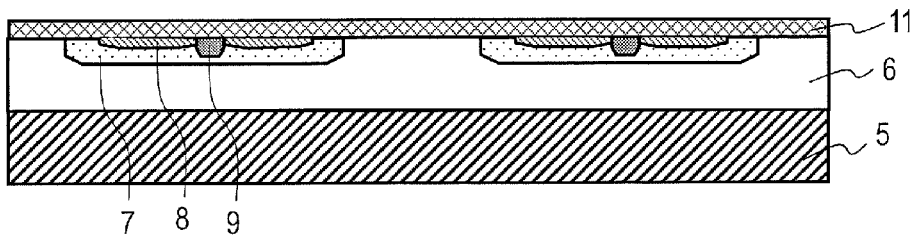
(b) 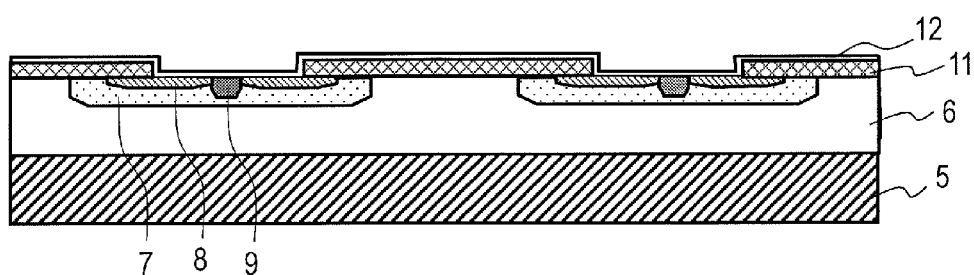
(c) 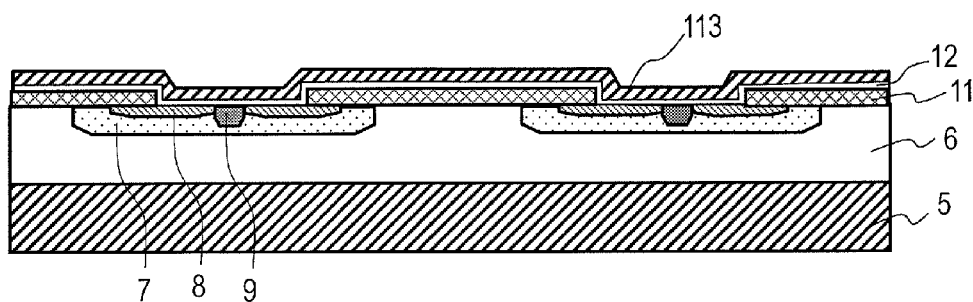
(d) 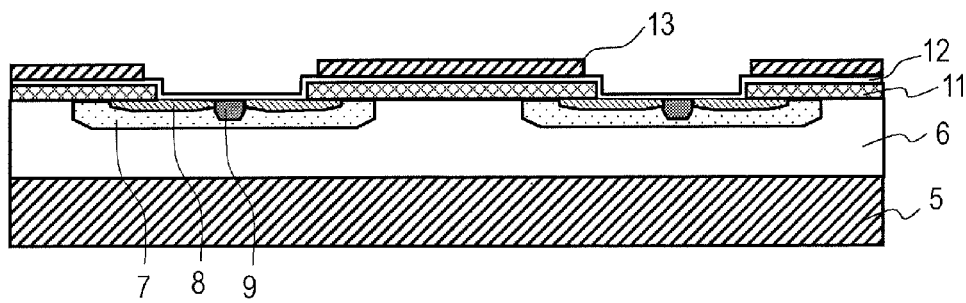
(e) 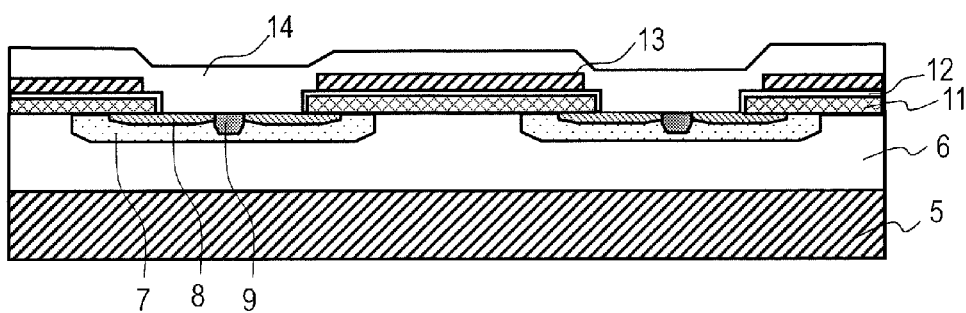

FIG.4
(a)
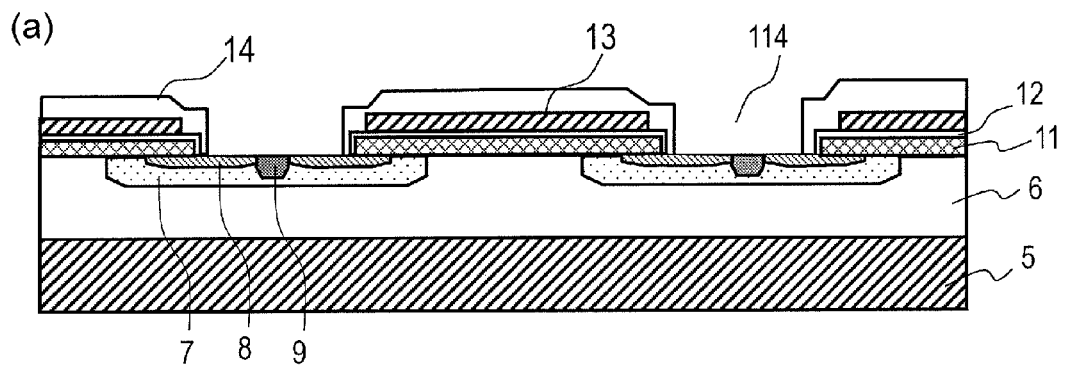
(b)
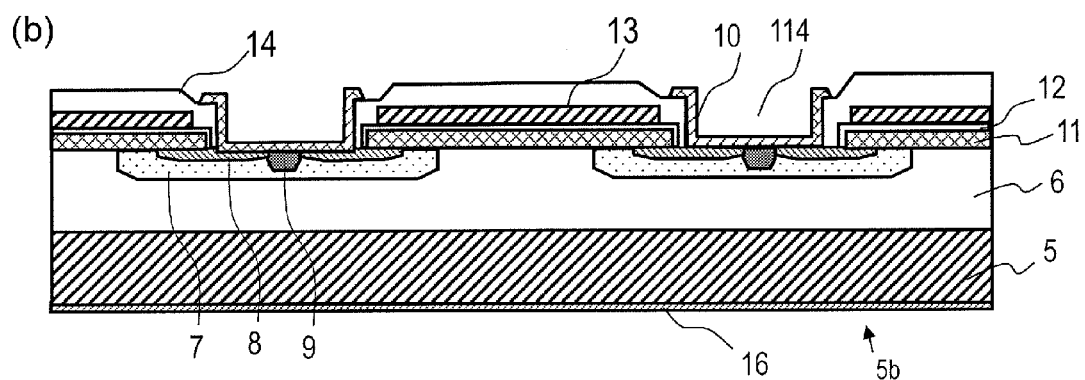
(c)
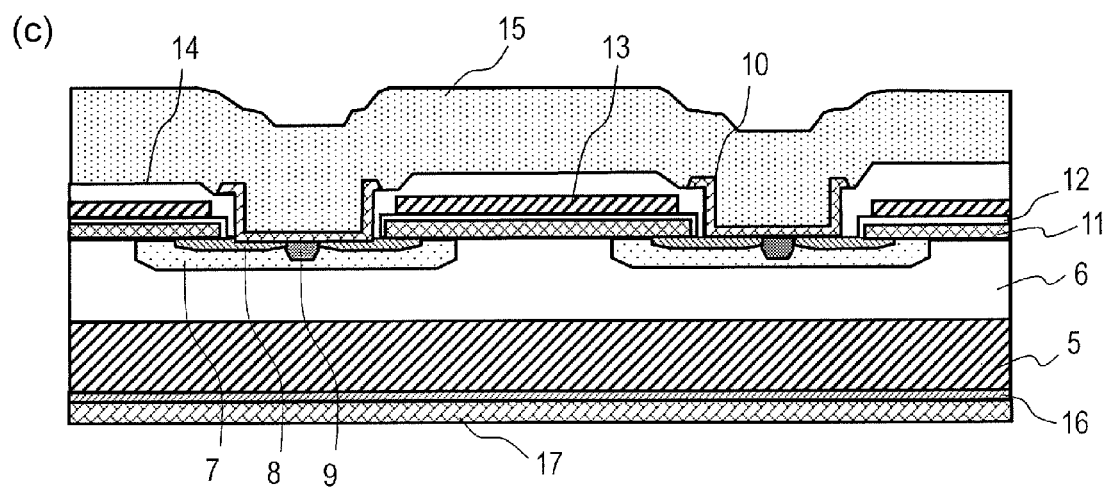

FIG.16
(a)
(b)
(c)
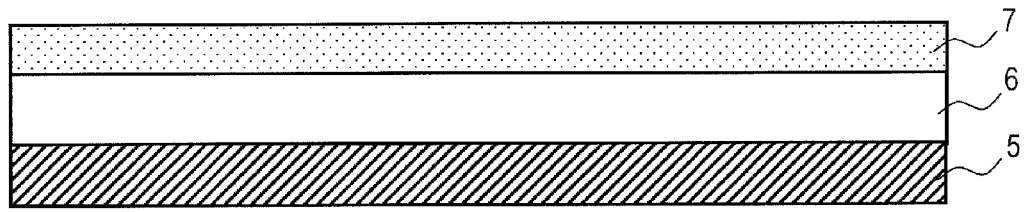
(d)
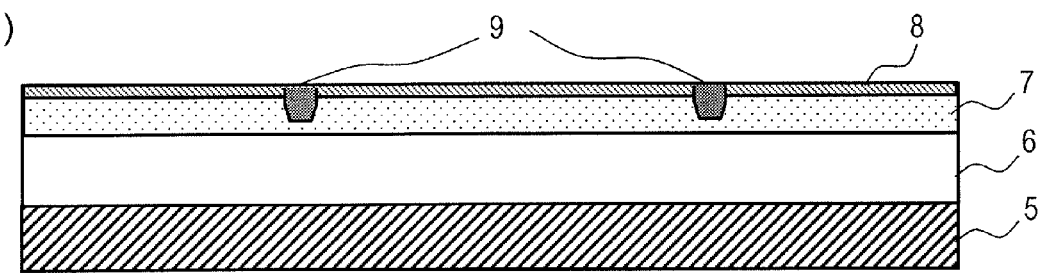
(e)
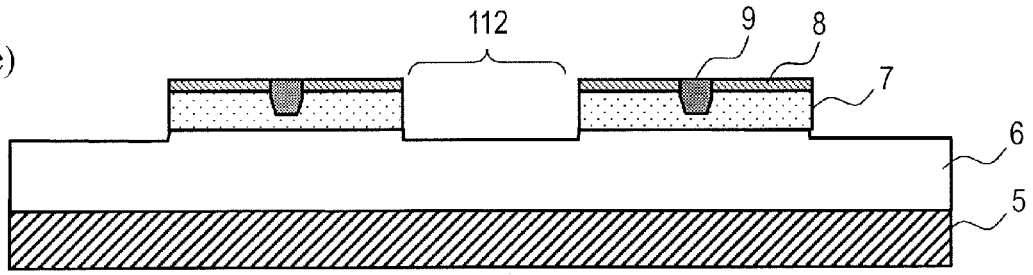

FIG. 28
(a) 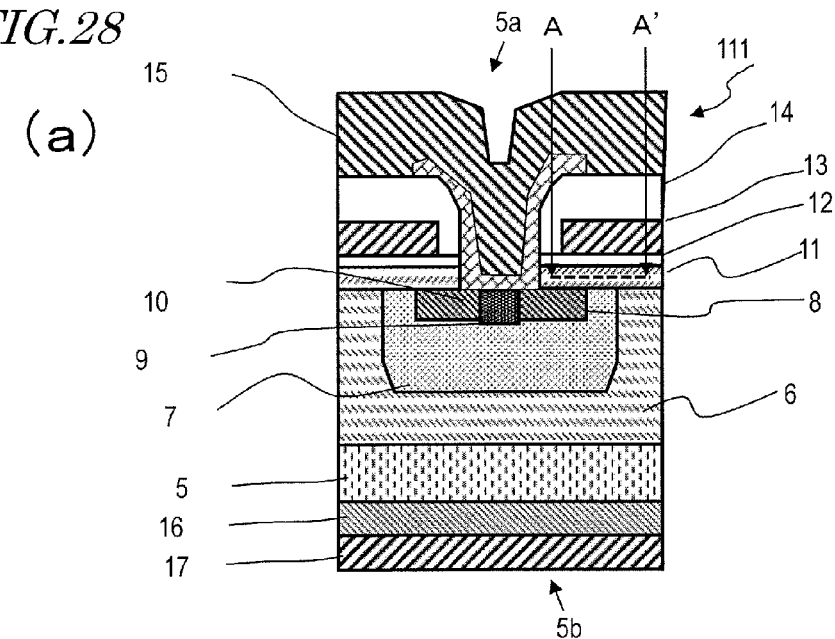
(b) 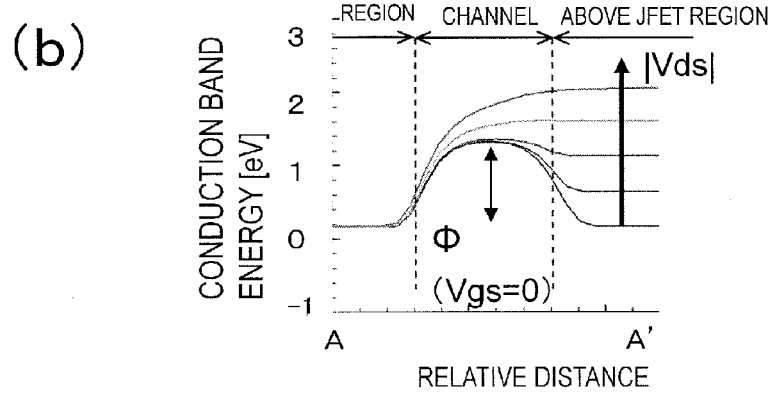
(c) 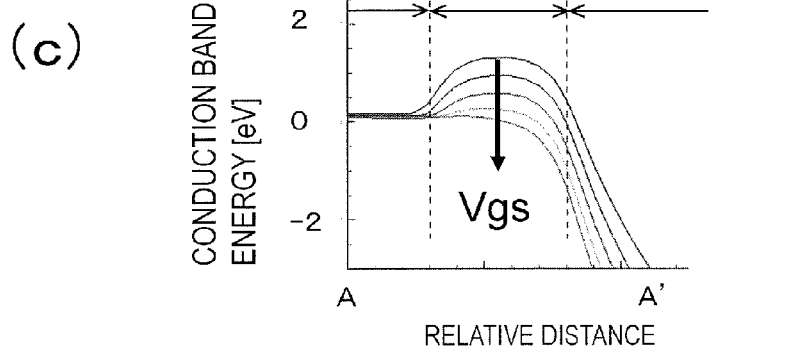

FIG.29
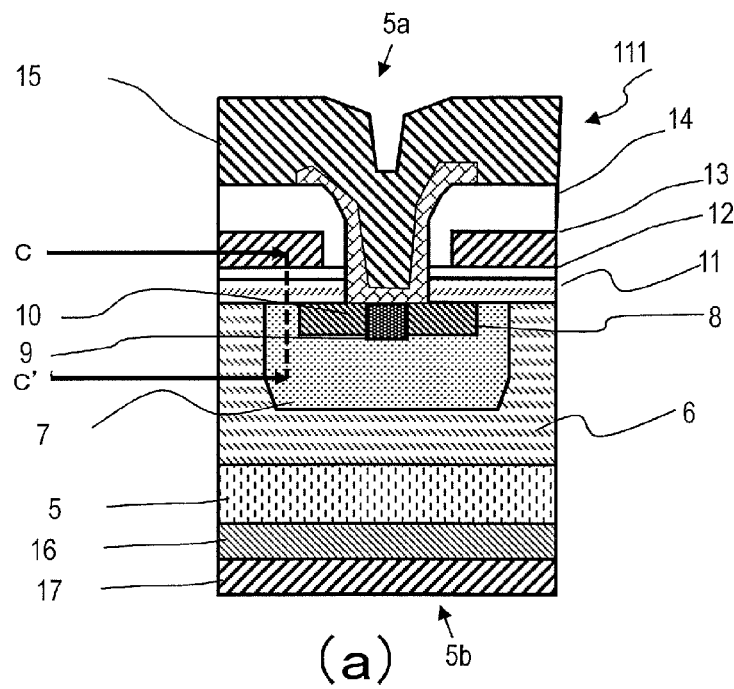
(a)
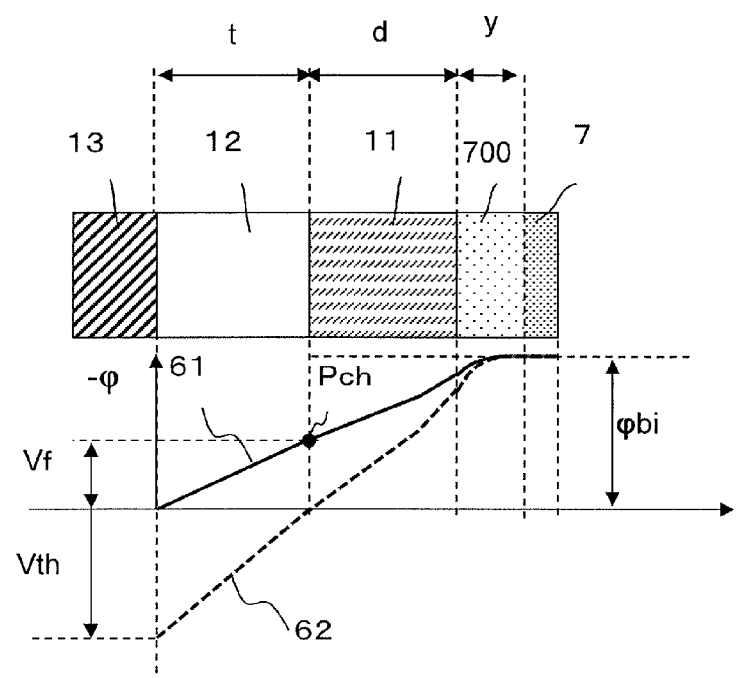
(b)

IMPURITY CONCENTRATION IN BODY REGION (cm$^{-3}$)

SEMICONDUCTOR DEVICE AND INVERTER USING SAME

TECHNICAL FIELD

The present disclosure relates to a semiconductor device having a silicon carbide semiconductor layer, and an inverter in which the same is used.

BACKGROUND ART

In recent years, vigorous development has been directed to power devices in which a silicon carbide semiconductor. Silicon carbide (SiC) is a semiconductor material with a high hardness, having a larger band gap than that of silicon (Si). Silicon carbide has dielectric breakdown field which is one order of magnitude higher than that of silicon. Therefore, use of silicon carbide makes it possible to produce a semiconductor device which has the same breakdown voltage as, but a smaller volume than, in the case of using silicon. Use of silicon carbide allows those constituent elements which serve as resistance components to be reduced as compared to using silicon, thereby making it possible to reduce the ON resistance of the semiconductor device and decrease its power loss. A silicon carbide semiconductor device also has an advantage of being able to operate at a higher temperature than is possible with silicon. A silicon carbide semiconductor device is used as a switching element composing a switching circuit, for example.

Some attempts at reducing losses in switching circuits have been made, which involve control of switching element operations (see, for example, Patent Document 1).

Patent Document 1 discloses a technique of, in a switching circuit composed of a half bridge circuit in which metal-oxide-semiconductor field effect transistors (MOSFETs) are used as switching elements, providing a transistor current detection means to detect a current flowing in a low-side MOSFET and a diode current detection means to detect a current flowing in the body diode of the low-side MOSFET functioning as a free-wheel diode, to thereby reduce recovery losses while suppressing the through-current.

Specifically, according to Patent Document 1, in a vertical MOSFET, a diode electrode is provided so as to achieve ohmic contact with the body region but without contact with the source region, the diode electrode being deployed in an electrically insulated state from the source electrode. Thus, by detecting a current flowing between the source electrode and the drain electrode, a current flowing through the MOSFET is detected, and by detecting a current flowing between the diode electrode and the drain electrode, a current flowing through the body diode can be detected. Among a plurality of unit cells, some unit cells have a means that detects a current between the source electrode and the drain electrode and a means that detects a current between the diode electrode and the drain electrode, which respectively function as the transistor current detection means and the diode current detection means. Patent Document 1 states that recovery losses can be reduced while suppressing the through-current, by setting a dead time so that the through-current which is detected by the transistor current detection means and the recovery current which is detected by the diode current detection means are both small.

On the other hand, Patent Document 2 discloses, in such an inverter as drives a motor, a construction including a transistor bridge circuit which is composed of a plurality of transistors and a diode bridge circuit which is composed of a plurality of diodes that are free-wheel diodes, where a first current detector is disposed across a plus line and a minus line between the transistor bridge circuit and the diode bridge circuit, and a second current detector is disposed between the transistor bridge circuit and diode bridge circuit and a DC power source. Patent Document 2 states that a driving current which flows during usual driving a reverse current which flows in a backflow operation, and a regenerative current which flows in a regeneration operation can be detected by using the first current detector and the second current detector, whereby an overcurrent occurring in each operation can be detected.

CITATION LIST

Patent Literature

[Patent Document 1] Japanese Laid-Open Patent Publication No. 2007-014059

[Patent Document 2] Japanese Laid-Open Patent Publication No. 6-14561

SUMMARY OF INVENTION

Technical Problem

However, the technique disclosed in Patent Document 1 requires, in order to detect a current flowing through the free-wheel diode, a diode current detection means to be provided in addition to the transistor current detection means, thus resulting in a complicated construction. The technique disclosed in Patent Document 2 features a construction in which the bridge circuit is two-divided into a diode bridge circuit and a transistor bridge circuit, thus resulting in long interconnects and a complicated construction. Moreover, current detectors for large current detection, which are expensive and large in size, are needed.

Therefore, the technique disclosed in the present specification provides a semiconductor device which can detect both a current flowing through a transistor and a current flowing through a free-wheel diode with a simple construction, and an inverter in which the same is used.

Solution to Problem

A semiconductor device which is disclosed in the present specification comprises: a semiconductor substrate of a first conductivity type, including a main region and a sense region; a plurality of unit cells provided in the main region and in the sense region of the semiconductor substrate of the first conductivity type, each unit cell having a metal-insulator-semiconductor field effect transistor, the number of unit cells in the sense region being smaller than the number of unit cells in the main region, the metal-insulator-semiconductor field effect transistors being connected in parallel connection in each of the main region and the sense region; a gate pad on a principal face side of the semiconductor substrate; a first source pad and second source pad insulated from each other; and a drain pad on a back side of the semiconductor substrate, each metal-insulator-semiconductor field effect transistor including a first silicon carbide semiconductor layer of the first conductivity type located on the principal face of the semiconductor substrate, a body region of a second conductivity type in contact with the first silicon carbide semiconductor layer, a source region of the first conductivity type in contact with the body region, a second silicon carbide semiconductor layer on the first silicon carbide semiconductor layer and in contact with at least a portion of the body region and at least a portion of the source region, a gate insulating film on the second silicon carbide semiconductor layer, a gate electrode on the gate insulating film, a source electrode in contact with the source region, and a drain electrode on the back side of the semiconductor substrate, wherein, given that Vds is a potential of the drain electrode relative to a potential of the source electrode, Vgs is a potential of the gate electrode relative to the potential of the source electrode, and Vth is a gate threshold voltage of the metal-insulator-semiconductor field effect transistor, when Vds is positive, the metal-insulator-semiconductor field effect transistor allows a current to flow from the drain electrode to the source electrode if Vgs is equal to or greater than Vth, when Vds is negative, the metal-insulator-semiconductor field effect transistor functions as a diode to allow a current to flow from the source electrode to the drain electrode if Vgs is less than Vth; an absolute value of an onset voltage of the diode is smaller than an absolute value of an onset voltage of a body diode which is constituted by the body region and the first silicon carbide semiconductor layer; the gate electrode of any unit cell in the main region and the gate electrode of any unit cell in the sense region are electrically connected to the gate pad; the drain electrode of any unit cell in the main region and the drain electrode of any unit cell in the sense region are electrically connected to the drain pad; the source electrode of any unit cell in the main region is electrically connected to the first source pad; and the source electrode of any unit cell in the sense region is electrically connected to the second source pad.

An inverter which is disclosed in the present specification comprises: a leg composed of an upper arm and a lower arm, at least one of the upper arm and the lower arm being the semiconductor device which is disclosed in the present specification; a current-voltage converter being connected to the second source pad of the semiconductor device, the current-voltage converter outputting a voltage of a value corresponding to the value of a current flowing between the drain pad and the second source pad; and a gate voltage controller for controlling a voltage to be applied to the gate pad of the semiconductor device based on the voltage output from the current-voltage converter.

Advantageous Effects of Invention

The semiconductor device disclosed in the present specification can detect both a current flowing through a transistor and a current flowing through a free-wheel diode, with a simple construction.

BRIEF DESCRIPTION OF DRAWINGS

FIG. 2 A cross-sectional view partially showing a method of producing a semiconductor device according to the first embodiment of the present disclosure.

FIG. 3 A cross-sectional view partially showing a method of producing a semiconductor device according to the first embodiment of the present disclosure.

FIG. 4 A cross-sectional view partially showing a method of producing a semiconductor device according to the first embodiment of the present disclosure.

FIG. 16 A cross-sectional view partially showing a method of producing a semiconductor device according to the second embodiment of the present disclosure.

FIG. 28 (a) A cross-sectional structural diagram of a unit cell according to the present embodiment; (b) is a diagram showing a distribution of conduction band energy across A-A' in (a) in a reverse operation; and (c) is a diagram shown a distribution of conduction band energy across A-A' in (a) in a forward operation.

FIG. 29 (a) a cross-sectional structural diagram of a unit cell according to the present embodiment; and (b) is a potential distribution chart across C-C' in (a).

DESCRIPTION OF EMBODIMENTS

Figure 1:
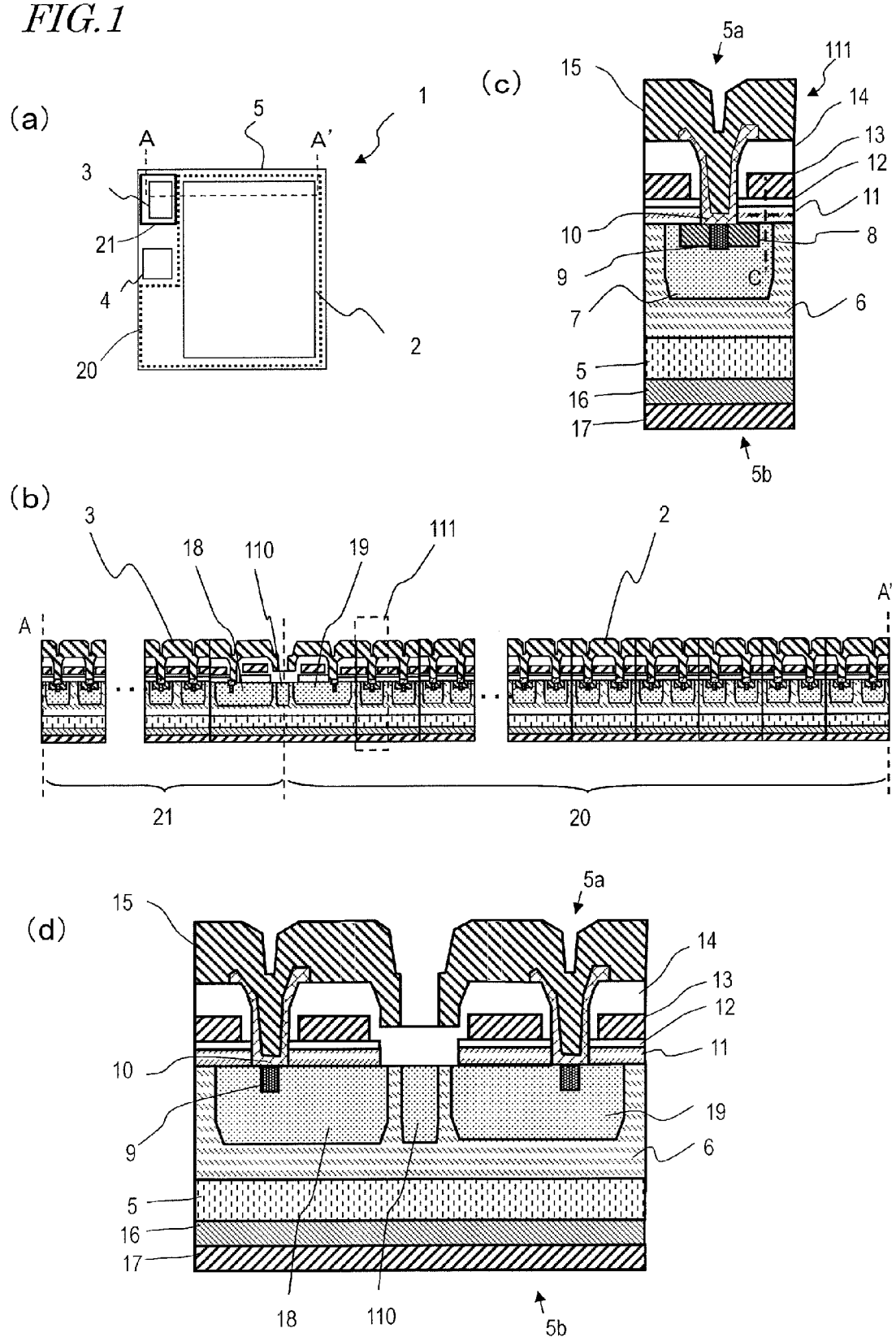
FIG. 1 (a) is a plan view generally showing a semiconductor device according to a first embodiment of the present disclosure; (b) is a cross-sectional view generally showing portion A-A' in (a); (c) is a cross-sectional view generally showing a unit cell of this semiconductor device; and (d) is an enlarged cross-sectional view near an element isolation region 110 shown in (b).

A semiconductor device of the present disclosure is generally as follows.

A semiconductor device according to an embodiment of the present disclosure comprises: a semiconductor substrate of a first conductivity type, including a main region and a sense region; a plurality of unit cells provided in the main region and in the sense region of the semiconductor substrate of the first conductivity type, each unit cell having a metal-insulator-semiconductor field effect transistor, the number of unit cells in the sense region being smaller than the number of unit cells in the main region, the metal-insulator-semiconductor field effect transistors being connected in parallel connection in each of the main region and the sense region; a gate pad on a principal face side of the semiconductor substrate; a first source pad and second source pad insulated from each other; and a drain pad on a back side of the semiconductor substrate, each metal-insulator-semiconductor field effect transistor including a first silicon carbide semiconductor layer of the first conductivity type located on the principal face of the semiconductor substrate, a body region of a second conductivity type in contact with the first silicon carbide semiconductor layer, a source region of the first conductivity type in contact with the body region, a second silicon carbide semiconductor layer on the first silicon carbide semiconductor layer and in contact with at least a portion of the body region and at least a portion of the source region, a gate insulating film on the second silicon carbide semiconductor layer, a gate electrode on the gate insulating film, a source electrode in contact with the source region, and a drain electrode on the back side of the semiconductor substrate, wherein, given that Vds is a potential of the drain electrode relative to a potential of the source electrode, Vgs is a potential of the gate electrode relative to the potential of the source electrode, and Vth is a gate threshold voltage of the metal-insulator-semiconductor field effect transistor, when Vds is positive, the metal-insulator-semiconductor field effect transistor allows a current to flow from the drain electrode to the source electrode if Vgs is equal to or greater than Vth, when Vds is negative, the metal-insulator-semiconductor field effect transistor functions as a diode to allow a current to flow from the source electrode to the drain electrode if Vgs is less than Vth; an absolute value of an onset voltage of the diode is smaller than an absolute value of an onset voltage of a body diode which is constituted by the body region and the first silicon carbide semiconductor layer; the gate electrode of any unit cell in the main region and the gate electrode of any unit cell in the sense region are electrically connected to the gate pad; the drain electrode of any unit cell in the main region and the drain electrode of any unit cell in the sense region are electrically connected to the drain pad; the source electrode of any unit cell in the main region is electrically connected to the first source pad; and the source electrode of any unit cell in the sense region is electrically connected to the second source pad.

At least a region of the body region that is in contact with the second silicon carbide semiconductor layer may have an impurity concentration of $1\times10^{18}$ cm$^{-3}$ or more; the second silicon carbide semiconductor layer may have an impurity concentration of not less than $1\times10^{17}$ cm$^{-3}$ and not more than $4\times10^{18}$ cm$^{-3}$; and the second silicon carbide semiconductor layer may have a thickness of not less than 20 nm and not more than 70 nm.

The semiconductor device may further comprise: the first silicon carbide semiconductor layer of the first conductivity type at a boundary between the main region and the sense region, the first silicon carbide semiconductor layer being on the semiconductor substrate; and an element isolation region of the second conductivity type in the first silicon carbide semiconductor layer, wherein no second silicon carbide semiconductor layer is provided over the element isolation region.

The semiconductor device may further comprise a trench penetrating through the body region and the source region and reaching the first silicon carbide semiconductor layer.

A current to flow in the sense region may be 100 mA or less.

A current flowing between the drain pad and the second source pad may be in proportion to a current flowing between the drain pad and the first source pad.

The direction of a current flowing between the drain pad and the second source pad may be identical to the direction of a current flowing between the drain pad and the first source pad.

An inverter according to an embodiment of the present disclosure comprises: a leg composed of an upper arm and a lower arm, at least one of the upper arm and the lower arm being any of the aforementioned semiconductor devices; a current-voltage converter being connected to the second source pad of the semiconductor device, the current-voltage converter outputting a voltage of a value corresponding to the value of a current flowing between the drain pad and the second source pad; and a gate voltage controller for controlling a voltage to be applied to the gate pad of the semiconductor device based on the voltage output from the current-voltage converter.

The current-voltage converter may include: an operational amplifier having an inverting input terminal, a non-inverting input terminal, and an output terminal; and a resistor connecting the inverting input terminal and the output terminal.

The operational amplifier may be of a dual supply type.

The inverter may further comprise: a smoothing capacitor in parallel connection with the leg; a voltage detector for detecting a voltage across the smoothing capacitor; and a regenerative power consuming circuit including a resistor to consume a regenerative current flowing from a load to the inverter as heat and a switching element to control the regenerative current to be flowed to the resistor, wherein the gate voltage controller may compare the voltage across the smoothing capacitor as detected by the voltage detector against a reference voltage value, and if the voltage across the smoothing capacitor exceeds the reference voltage value, control the switching element to flow the regenerative current to the resistor.

The inverter may further comprise: a smoothing capacitor in parallel connection with the leg; and a voltage detector for detecting a voltage across the smoothing capacitor, wherein the gate voltage controller may compare the voltage across the smoothing capacitor as detected by the voltage detector against a reference voltage value, and if the voltage across the smoothing capacitor exceeds the reference voltage value, ensure that a negative voltage is applied to the gate pad.

The inverter may further comprise: a smoothing capacitor in parallel connection with the leg; and a regenerative power consuming circuit including a resistor to consume a regenerative current flowing from a load to the inverter as heat and a switching element to control the regenerative current to be flowed to the resistor, wherein the gate voltage controller may compare the value of the output voltage output from the current-voltage converter against a reverse reference voltage value, and if an absolute value of the output voltage exceeds the reverse reference voltage value, control operation of the switching element so that the regenerative current flows to the resistor.

The inverter may further comprise a smoothing capacitor in parallel connection with the leg, wherein the gate voltage controller may compare the value of the output voltage output from the current-voltage converter against a reverse reference voltage value, and if an absolute value of the output voltage exceeds the reverse reference voltage value, ensure that a negative voltage is applied to the gate pad.

A method of controlling an inverter according to an embodiment of the present disclosure is a method of controlling an inverter including a leg composed of an upper arm and a lower arm, at least one of the upper arm and the lower arm being any of the aforementioned semiconductor devices, and a smoothing capacitor in parallel connection with the leg, the method comprising: a step of detecting a voltage across the smoothing capacitor; and a step of comparing the voltage across the smoothing capacitor against a reference voltage value, and if the voltage across the smoothing capacitor exceeds the reference voltage value, ensuring that a negative voltage is applied to the gate pad.

A method of controlling an inverter according to an embodiment of the present disclosure is a method of controlling an inverter including a leg composed of an upper arm and a lower arm, at least one of the upper arm and the lower arm being any of the aforementioned semiconductor devices, a smoothing capacitor in parallel connection with the leg, a current-voltage converter being connected between the semiconductor device and the second source pad and outputting a voltage of a value corresponding to the value of a current flowing between the drain pad and the second source pad, and a regenerative power consuming circuit including a resistor to consume a regenerative current flowing from a load to the inverter as heat and a switching element to control the regenerative current to be flowed to the resistor, the method comprising: a step of detecting the value of the output voltage output from the current-voltage converter; and a step of comparing the value of the output voltage output from the current-voltage converter against a reverse reference voltage value, and if an absolute value of the output voltage exceeds the reverse reference voltage value, operating the switching element so that the regenerative current flows to the resistor.

A method of controlling an inverter according to an embodiment of the present disclosure is a method of controlling an inverter including a leg composed of an upper arm and a lower arm, at least one of the upper arm and the lower arm being any of the aforementioned semiconductor devices, a smoothing capacitor in parallel connection with the leg, and a current-voltage converter being connected to the second source pad of the semiconductor device and outputting a voltage of a value corresponding to the value of a current flowing between the drain pad and the second source pad, the method comprising: a step of detecting the value of the output voltage output from the current-voltage converter; and a step of comparing the value of the output voltage output from the current-voltage converter against a reverse reference voltage value, and if an absolute value of the output voltage exceeds the reverse reference voltage value, ensures that a negative voltage is applied to the gate pad.

Hereinafter, with reference to the drawings, embodiments of the present disclosure will be described.

First Embodiment

Structure of the Semiconductor Device

FIG. 1(a) is a plan view generally showing a semiconductor device of the present embodiment. FIG. 1(b) is a cross-sectional view generally showing portion A-A' in FIG. 1(a). FIG. 1(c) is a cross-sectional view generally showing a unit cell 111 in FIG. 1(b). FIG. 1(d) is a cross-sectional view showing enlarged the neighborhood of an element isolation region 110 shown in FIG. 1(b). The present embodiment will illustrate an example where the unit cell 111 is a metal-insulator-semiconductor field effect transistor (MISFET) of a planar type.

As shown in FIG. 1(a), the semiconductor device 1 includes a semiconductor substrate 5. Also, it includes a main region source pad 2, a sense region source pad 3, and a gate pad 4 on a principal face 5a side of the semiconductor substrate 5. The main region source pad 2, the sense region source pad 3, and the gate pad 4 are electrically insulated from one another. A drain electrode 16 and a back side electrode 17 are layered on a back side 5b of the semiconductor device 1, so as to cover the entire back side 5b.

The main region source pad 2, the sense region source pad 3, and the back side electrode 17 correspond to a first source pad, a second source pad, and a drain pad of the semiconductor device which is disclosed in the present specification.

As shown in FIGS. 1(a) and (b), the semiconductor device 1 has a sense region 21 and a main region 20. The sense region 21 and the main region 20 each include a plurality of unit cells 111, which are in parallel connection with one another.

The main region source pad 2 is composed of upper interconnects 15 of the plurality of unit cells 111 in the main region 20 being connected with one another. Similarly, the sense region source pad 3 is composed of upper interconnects 15 of the plurality of unit cells 111 in the sense region 21 being connected with one another.

In a first silicon carbide semiconductor layer 6 of a first conductivity type at the boundary between the sense region 21 and the main region 20, unlike in unit cells, edge termination base regions 18 and 19 and an element isolation region 110 are provided. The edge termination base regions 18 and 19 and the element isolation region 110 are both of a second conductivity type. The edge termination base regions 18 and 19 do not include any source region of the first conductivity type because, if any source region were provided in the edge termination base regions 18 and 19, a large current might flow in a parasitic bipolar which is composed of the source region, the edge termination base regions 18 and 19, and the first silicon carbide semiconductor layer 6, thus possibly destroying the semiconductor device 1. A source electrode 10 is provided on the edge termination base regions 18 and 19, so as to be electrically connected with source electrodes 10 of the unit cells 111 via the upper interconnects 15. Therefore, the edge termination base regions 18 and 19 and the source regions 8 of the unit cell 111 are at the same potential. The edge termination base regions 18 and 19 constitute a PN diode with the first silicon carbide semiconductor layer 6.

The element isolation region 110 is located between the edge termination base region 18 and the edge termination base region 19. No source electrode 10 is provided on the element isolation region 110, so that the potential of the element isolation region 110 is a floating potential. The element isolation region 110 prevents a current from flowing between the sense region 21 and the main region 20.

As shown in FIG. 1(d), no second silicon carbide semiconductor layer 11 is provided above the element isolation region 110 or at edge portions of the edge termination base regions 18 and 19. This prevents a current from flowing between the main region 20 and the sense region 21 via the second silicon carbide semiconductor layer 11, thus allowing a current flowing in the sense region 21 to be detected in a distinguishable manner over a current flowing in the main region 20.

Gate electrodes 13 of adjacent unit cells 111 are electrically connected to each other via a gate line not shown. The gate electrodes 13 in the main region 20 and the sense region 21 are all electrically connected to the gate pad 4.

The following relational equation (1) holds true, assuming a ratio n of the number of cells in the main region to that in the sense region, a current Iss flowing in the sense region, and a current Ism flowing in the main region.

$$Ism = n \times Iss \quad (1)$$

Thus, from the current flowing in the sense region and the cell number ratio, a current flowing in the main region can be indirectly detected. Assuming a cell number ratio of about 1000, even if a current flowing in the main region is on the order of A, a current flowing in the sense region will be on the order of mA. Therefore, with a simple circuit for detecting a small current on the mA order, it is possible to indirectly detect a large current on the order of A.

Referring to FIG. 1(c), the structure of the unit cell 111 will be described. On the principal face of the n type semiconductor substrate 5, the n type first silicon carbide semiconductor layer 6 is provided. As the semiconductor substrate 5, an off-cut substrate which is off from the 4H—SiC(0001) plane by 4° in the [11-20] direction is used, for example. The n type impurity in the semiconductor substrate 5 has a doping concentration of about $1 \times 10^{19}$ cm$^{-3}$. Moreover, for example, the n type impurity in the first silicon carbide semiconductor layer 6 has a doping concentration of about $7 \times 10^{15}$ cm$^{-3}$, and the first silicon carbide semiconductor layer 6 has a thickness of about 13 µm.

A p type body region (well region) 7 is provided on the surface layer of the first silicon carbide semiconductor layer 6. For example, the body region 7 has a depth of about 0.8 µm, and the p type impurity in the body region 7 has a doping concentration of $2 \times 10^{18}$ to $2 \times 10^{19}$ cm$^{-3}$. An n type source region 8 is provided in the body region 7. For example, the source region 8 has a depth of about 0.2 µm, and the n type impurity in the source region 8 has a doping concentration of about $5 \times 10^{19}$ cm$^{-3}$. In the surface layer of the body region 7, a p type contact region 9 is provided. For example, the contact region 9 has a depth of about 200 nm, and the p type impurity in the contact region 9 has a doping concentration of about $2 \times 10^{20}$ cm$^{-3}$.

A source electrode 10 is provided in contact with a portion of the source region 8 and a portion of the contact region 9. The source electrode 10 is made of nickel silicide having been formed through a heat treatment of nickel with a thickness of about 100 nm, for example. The source electrode 10 has ohmic contact with the source region 8 and the contact region 9.

On the surface of the first silicon carbide semiconductor layer 6 including the source region 8 and the body region 7, the second silicon carbide semiconductor layer 11 is provided. The second silicon carbide semiconductor layer 11 is an epitaxial layer which is epitaxially grown on the first silicon carbide semiconductor layer 6, for example. In the case where the second silicon carbide semiconductor layer 11 is composed of a single n type layer, the thickness of the second silicon carbide semiconductor layer 11 may be 75 nm or less, and the doping concentration of the n type impurity in the second silicon carbide semiconductor layer 11 may be $1 \times 10^{18}$ cm$^{-3}$ or more, for example.

However, in the case where the second silicon carbide semiconductor layer 11 is composed of a single n type layer, any fluctuations in its doping profile may result in large fluctuations in the threshold voltage in the forward direction and the onset voltage of the channel diode. In some cases, the film thickness of the second silicon carbide semiconductor layer 11 may become reduced during the sacrificial oxidation and gate oxidation steps. Variation in the decrease in film thickness of the second silicon carbide semiconductor layer 11 during the production steps causes variation in the electrical characteristics of the semiconductor device 1, e.g., threshold voltage in the forward direction and onset voltage in the reverse direction. Therefore, by stacking a low-concentration doped layer on the surface of the n type impurity layer, variation in the electrical characteristics of the semiconductor device 1 can be reduced.

Moreover, when the second silicon carbide semiconductor layer 11 is epitaxially grown, the growth rate may not be stable, and the impurity concentration may also not be stable, in the initial period of growth. In this case, a dopant gas may not be flowed in the initial period of growth, and an undoped layer or a low-concentration doped layer with residual nitrogen may be grown, and a high-concentration n type impurity layer may be grown only after the growth rate becomes stable. In this manner, fluctuations in the impurity concentration due to the unstable growth rate in the initial period of growth can be reduced.

In other words, the second silicon carbide semiconductor layer 11 may have a multilayer structure including a bottom layer composed of an undoped or low-impurity concentration n type layer, a high concentration n type impurity layer, and a capping layer composed of an undoped or low-impurity concentration n type layer. The respective layers may have the following thicknesses: for example, the bottom layer may be about 10 to about 50 nm; the high concentration n type impurity layer may be 15 to 30 nm; and the capping layer may be 10 to 100 nm. The respective layers may have the following n type impurity concentrations, for example: less than $1 \times 10^{17}$ cm$^{-3}$ for the bottom layer; about $1 \times 10^{19}$ to about $1 \times 10^{19}$ cm$^{-3}$ for the high concentration n type impurity layer; and less than $1 \times 10^{17}$ cm$^{-3}$ for the capping layer. Note that the impurity concentration in each layer does not need to be constant, but may have a distribution along the film thickness direction of the respective layer.

A gate insulating film 12 is provided on the second silicon carbide semiconductor layer 11. The gate insulating film 12 has a thickness of about 70 nm.

The gate electrode 13 is provided on the gate insulating film 12. For example, the gate electrode 13 is an n type poly-Si doped with about $7 \times 10^{20}$ cm$^{-3}$ of phosphorus, and the gate electrode 13 has a thickness of about 500 nm.

An interlevel dielectric film 14 is provided on the gate electrode 13. The interlevel dielectric film 14 is made of a silicon oxide film, for example. The interlevel dielectric film 14 has a thickness of about 1 µm. The upper interconnect 15, which is electrically connected with the source electrode 10, is provided on the interlevel dielectric film 14. The upper interconnect 15 is made of aluminum, for example. The upper interconnect 15 has a thickness of about 4 µm.

On the back side of the semiconductor substrate 5, the drain electrode 16 is provided, which has ohmic contact with the semiconductor substrate 5. The drain electrode 16 is made of titanium silicide having been formed through a heat treatment of Ti with a thickness of about 150 nm, for example. On the drain electrode 16, the back side electrode 17 for die bonding is provided. In the order of descending distance from the drain electrode 16, the back side electrode 17 is composed of titanium with a thickness of about 100 nm, nickel with a thickness of about 300 nm, and silver with a thickness of about 700 nm, for example.

In the present disclosure, this unit cell has the following construction, whereby the unit cell possesses the function of a field effect transistor and the function of a diode.

Next, with reference to FIG. 28, the operations of the unit cell 111 in the forward direction and in the reverse direction will be described. FIG. 28(a) is a cross-sectional view of the unit cell 111; FIG. 28(b) is a diagram showing a distribution of conduction band energy across A-A' in (a) in a reverse operation; and FIG. 28(c) is a diagram showing a distribution of conduction band energy across A-A' in (a) in a forward operation. In FIGS. 28(b) and (c), the region to the left of the left dotted line represents a conduction band energy distribution of a portion of the second silicon carbide semiconductor layer 11 that is located over the source region 8; the region sandwiched between the right and left dotted lines represents a conduction band energy distribution of the channel; and region to the right of the right dotted line represents a conduction band energy distribution of a portion of the second silicon carbide semiconductor layer 11 that is located over the JFET region. The channel is the portion of the second silicon carbide semiconductor layer 11 that is located over the body region. the JFET region is the region of the first silicon carbide semiconductor layer 6 that is located between two adjacent body regions.

With reference to FIG. 28(b), an operation of the unit cell 111 in the reverse direction will be described. FIG. 28(b) assumes Vgs=0. When Vds=0, the conduction band energy distribution across A-A' is represented by the lowermost curve in the graph shown in FIG. 28(b). At this time, the second silicon carbide semiconductor layer 11 has a potential of Vf0 with respect to the source potential. When Vds=0, the portion of the second silicon carbide semiconductor layer 11 that is located over the JFET region has a potential which is Vf0 lower than the potential of the channel, and thus electrons cannot flow into the channel from the portion of the second silicon carbide semiconductor layer 11 that is located over the JFET region. However, when Vds is made negative, as is indicated by an arrow in FIG. 28(b), the potential of the portion of the second silicon carbide semiconductor layer 11 that is located over the JFET region will become greater than the potential of the portion of the second silicon carbide semiconductor layer 11 that is located over the source region 8. Once Vds<−Vf0, the potential of the portion of the second silicon carbide semiconductor layer 11 that is located over the JFET region is higher than the channel potential, so that electrons will flow from the portion of the second silicon carbide semiconductor layer 11 that is located over the JFET region, via the channel, into the portion of the second silicon carbide semiconductor layer 11 that is located over the source region 8. That is, a reverse current will flow in the unit cell 111. This operation is a diode operation, and Vf0 is an onset voltage of the channel diode.

Next, with reference to FIG. 28(c), a forward operation of the unit cell 111 will be described. In FIG. 28(c), the drain has a positive potential with respect to the source. When Vgs=0, the conduction band energy distribution across A-A' is represented by the uppermost curve in the graph shown in FIG. 28(c). When Vgs=0, the channel has a higher energy than does the portion of the second silicon carbide semiconductor layer 11 that is located over the source region 8, thus serving as a barrier; therefore, electrons will not flow into the channel from the portion of the second silicon carbide semiconductor layer 11 that is located over the source region 8. When Vgs is increased, as indicated by an arrow in FIG. 28(c), the channel energy will decrease. Once the energy of the channel becomes lower than that of the portion of the second silicon carbide semiconductor layer 11 that is located over the source region 8, electrons will flow from the portion of the second silicon carbide semiconductor layer 11 that is located over the source region 8, via the channel, into the portion of the second silicon carbide semiconductor layer 11 that is located over the JFET region. That is, a forward current will flow in the unit cell 111.

FIG. 29 is a schematic diagram showing a potential distribution of the unit cell along the depth direction, according to the present disclosure. In FIG. 29, (a) is a cross-sectional view of the unit cell, and (b) is a potential distribution chart across C-C' in (a).

Shown above FIG. 29(b) is a correspondence between the horizontal axis of the potential distribution chart and various regions of the unit cell.

The horizontal axis represents depth relative to the interface between the gate insulating film 12 and the gate electrode 13. The vertical axis represents potential (−Φ) relative to the source potential.

This potential distribution can be calculated from Poisson's equation.

The curve 61 shows a potential distribution when Vgs=0. Since Vgs=0, the potential of the interface between the gate insulating film 12 and the gate electrode 13 is 0.

Suppose that the gate insulating film 12 has a film thickness t, and that the second silicon carbide semiconductor layer 11, assuming a uniform impurity concentration thereof, contains a first conductivity type impurity at a concentration Nd, with a film thickness d. The body region 7 has an impurity concentration Nb. It is assumed that any surface of the body region 7 that is in contact with the second silicon carbide semiconductor layer 11 is depleted, so that a depletion layer 700 with a thickness y is formed. Similarly, on the second silicon carbide semiconductor layer 11, a depletion layer extending from its plane of junction with the body region and a depletion layer extending from its interface with the gate insulating film are formed. It is assumed that the film thickness of the second silicon carbide semiconductor layer 11 is set so that these depletion layers overlap each other. In other words, the entire second silicon carbide semiconductor layer 11 is depleted. If the second silicon carbide semiconductor layer 11 is thus depleted when Vgs=0, then normally-OFF. In order to deplete the second silicon carbide semiconductor layer 11, it is preferable to increase the impurity concentration Nb of the body region 7 and decrease the film thickness d of the second silicon carbide semiconductor layer 11.

Note that the source region and the body region constitute a PN junction, and the potential of the body region as viewed from the source region is a built-in potential Φbi. When Vgs=0, the potential of the interface between the gate electrode 13 and the gate insulating film 12 is equal to the source potential; therefore, the potential of the body region 7 as viewed from the interface between the gate electrode 13 and the gate insulating film 12 is the built-in potential Φbi, too.

The potential Pch of the interface between the gate insulating film 12 and the second silicon carbide semiconductor layer 11 is expressed by eq. (2). Herein, ε i is the dielectric constant of the gate insulating film 12, and q is the elementary charge.

[math. 1]

$$Pch = \varphi bi - \frac{q}{2\varepsilon i} \times (Nb \times y(y + 2d) - Nd \times d^2) \quad (2)$$

Pch, when Vgs=0, corresponds to the onset voltage Vf0 of the diode. It can be seen from eq. (2) that |Vf0| can be made small by increasing the impurity concentration Nb of the body region.

Figure 30:
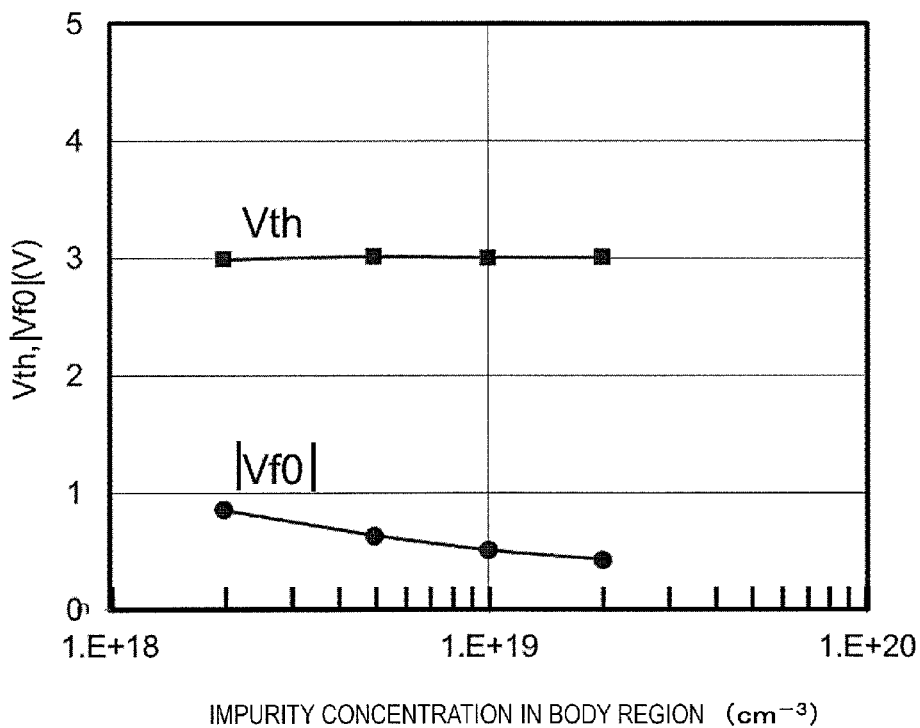
FIG. 30 A diagram showing correlation between the dopant concentration in a body region of a semiconductor device of the present embodiment and Vth and |Vf0|.

FIG. 30 illustrates the threshold voltage Vth of the transistor and the onset voltage |Vf0| of the channel diode when the impurity concentration in the body region 7 that is in contact with the second silicon carbide semiconductor layer 11 is varied. In FIG. 30, the impurity concentration in the body region 7 is varied between $2 \times 10^{18}$ cm$^{-3}$, $5 \times 10^{18}$ cm$^{-3}$, $1 \times 10^{19}$ cm$^{-3}$, and $2 \times 10^{19}$ cm$^{-3}$. When the impurity concentration in the body region 7 changes, the threshold voltage Vth also changes; herein, the impurity concentration in the second silicon carbide semiconductor layer 11 is appropriately altered so as to give a threshold voltage Vth of about 3 V. FIG. 30 shows a tendency where the onset voltage |Vf0| decreases as the dopant concentration in the body region 7 increases, given a constant threshold voltage Vth. As can be seen from FIG. 30, by increasing the impurity concentration in the body region 7 that is in contact with the second silicon carbide semiconductor layer 11, the onset voltage |Vf0| of the channel diode can be selectively reduced, while maintaining the threshold voltage Vth of the transistor.

The above study has led to the finding that, in order to reduce the absolute value |Vf0| of the onset voltage of the channel diode, it is desirable that the impurity concentration in the body region is high. For example, the onset voltage |Vf0| of the channel diode can be reduced by ensuring that the impurity concentration in the body region is $1 \times 10^{18}$ cm$^{-3}$ or more. In the case of SiC, the body diode will have an onset voltage of about 2.7 V. The impurity concentration in the body region may be $2 \times 10^{18}$ cm$^{-3}$ or more.

Figure 31:
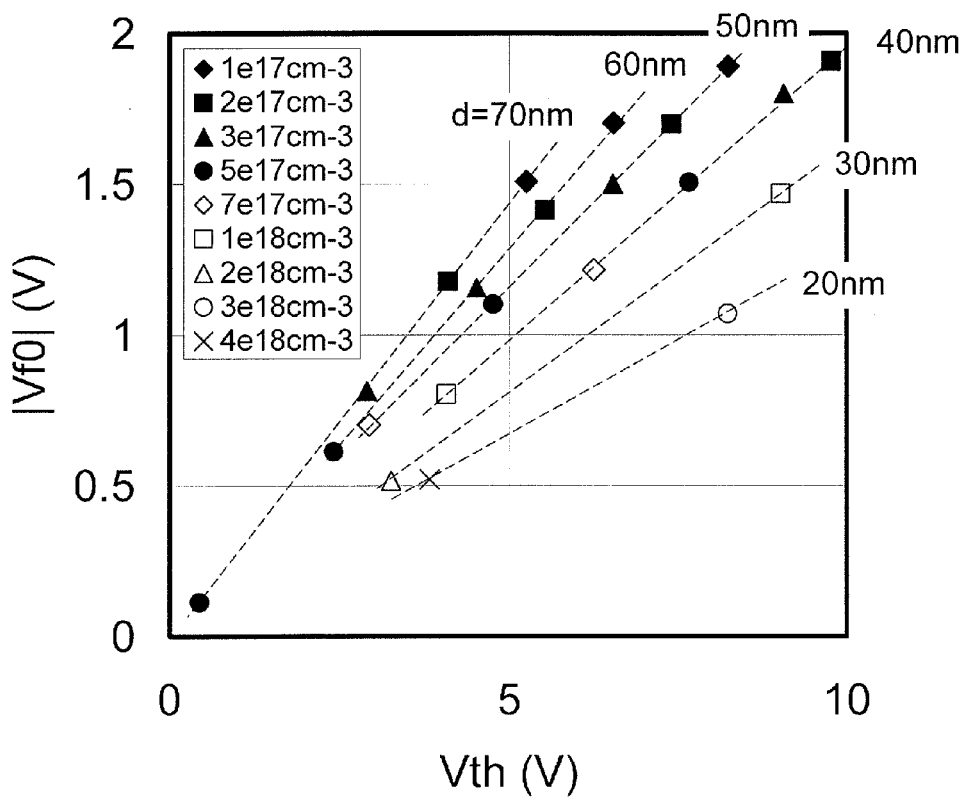
FIG. 31 A diagram showing correlation between Vth and |Vf0| in a semiconductor device of the present embodiment, where the thickness d and the impurity concentration Nd of a second silicon carbide semiconductor layer are varied.

FIG. 31 shows a relationship between Vth and |Vf0| where the thickness d of the second silicon carbide semiconductor layer 11 and the concentration of the impurity concentration Nd are varied when Nb=$1 \times 10^{19}$ cm$^{-3}$. In FIG. 31, the horizontal axis represents the threshold voltage Vth of the forward current, and the vertical axis represents the absolute value (|Vf0|) of the onset voltage Vf0 of the reverse current. In the simulation that was conducted to result in this figure, the concentration in the p type body region (well region) was fixed at $1 \times 10^{19}$ cm$^{-3}$, and the thickness of the gate insulating film at 70 nm. The thickness range of the second silicon carbide semiconductor layer 11 is not less than 20 nm and not more than 70 nm, and the range of impurity concentration in the second silicon carbide semiconductor layer 11 is not less than $1 \times 10^{17}$ cm$^{-3}$ and not more than $4 \times 10^{18}$ cm$^{-3}$.

It can be seen from FIG. 31 that, by reducing the thickness of the channel epitaxial layer and increasing the impurity concentration in the channel epitaxial layer, for example, Vth can be made large while keeping a constant |Vf0|. Therefore, by setting a moderate impurity concentration and thickness for the channel epitaxial layer, it is possible to control Vth and |Vf0| each independently.

For example, a method of setting the thickness and impurity concentration in the channel epitaxial layer to ensure that Vth=5 V and | Vf0|=1 V will be described with reference to this figure.

First, a thickness of the channel epitaxial layer that corresponds to a correlation line which passes through an intersection between Vth=5 V and |Vf0|=1 V is found. This reads about 40 nm in FIG. 31. Therefore, the thickness of the channel epitaxial layer is set to 40 nm. Next, at the aforementioned thickness of the channel epitaxial layer, an impurity concentration that makes Vth=5 V is to be set. In this case, a midpoint between the concentrations of two points where data exists, i.e., $7 \times 10^{17}$ cm$^{-3}$ and $1 \times 10^{18}$ cm$^{-3}$, may be adopted, thus resulting in about $8.5 \times 10^{17}$ cm$^{-3}$.

It can be seen from FIG. 31 that, when the thickness d of the second silicon carbide semiconductor layer 11 is not less than 20 nm and not more than 70 nm and the impurity concentration Nd is not less than $1 \times 10^{17}$ cm$^{-3}$ and not more than $4 \times 10^{18}$ cm$^{-3}$, it can be ensured that the threshold voltage Vth>0 and that the onset voltage |Vf0| of the channel diode is smaller than the onset voltage of the body diode (which is about 2.7 V for SiC).

The film thickness t of the gate oxide film may be 20 nm or more, and 100 nm or less. When the film thickness t of the gate oxide film is 100 nm or less, a quality oxide film can be formed through thermal oxidation, without requiring a long time.

Although the above description assumes for simplicity that the second silicon carbide semiconductor layer 11 is a single layer with a uniform impurity concentration Nd, the impurity concentration may have a distribution so long as its mean impurity concentration is Nd.

Moreover, it is not necessary that the body region has a uniform impurity concentration distribution, either; at least the region in which a depletion layer extends from its interface with the second silicon carbide semiconductor layer 11 may satisfy the aforementioned concentrations. For example, it suffices if a region of at least 100 nm or more from the interface with the second silicon carbide semiconductor layer 11 satisfies the aforementioned range of impurity concentration.

(Method of Producing the Semiconductor Device)

Next, with reference to FIG. 2 to FIG. 4, a method of producing the semiconductor device of the present embodiment will be described. FIG. 2 to FIG. 4 are cross-sectional views showing a method of producing the semiconductor device of the present embodiment.

First, as shown in FIG. 2(*a*), an n type semiconductor substrate 5 is provided. As the semiconductor substrate 5, an off-cut substrate which is off from the 4H—SiC(0001) plane by 4° in the [11-20] direction is used, for example.

Next, as shown in FIG. 2(*b*), an n type first silicon carbide semiconductor layer 6 is epitaxially grown on the semiconductor substrate 5. The first silicon carbide semiconductor layer 6 is made of 4H—SiC, for example. The n type impurity concentration in the first silicon carbide semiconductor layer 6 is made lower than the n type impurity concentration in the semiconductor substrate 5.

Next, as shown in FIG. 2(*c*), on the first silicon carbide semiconductor layer 6, a mask (not shown) of e.g. $SiO_2$ is formed, and Al ions or B ions are implanted therein to form body regions 7. Although not shown, a field limited ring (FLR), an edge termination base region 18 of the sense region, an edge termination base region 19 of the main region, and an element isolation region 110 are simultaneously formed through this ion implantation, in an edge termination region of the semiconductor device 1. Therefore, the body regions 7, the edge termination base region 18 of the sense region, the edge termination base region 19 of the main region, and the element isolation region 110 are formed with the same p-type dopant concentration and the same depth. However, this is not a limitation; these regions may be individually formed. In the case where these regions are individually formed, their p-type dopant concentrations and depths may be set individually.

Next, as shown in FIG. 2(*d*), nitrogen ions are implanted into each body region 7 by using a mask (not shown) to form a source region 8, and Al ions are implanted into each body region 7 by using another mask (not shown) to form a contact region 9. After the ion implantation, the masks are removed and an activation annealing is conducted. The activation annealing is performed in an inert ambient at a temperature of about 1700° C. for about 30 minutes, for example.

Next, as shown in FIG. 3(*a*), on the entire surface of the first silicon carbide semiconductor layer 6 including the body regions 7, the source regions 8, and the contact regions 9, a second silicon carbide semiconductor layer 11 is epitaxially grown.

Next, as shown in FIG. 3(*b*), partial regions of the second silicon carbide semiconductor layer 11 are removed by dry etching so that a portion of each source region 8 and the surface of each contact region 9 are exposed, and thereafter, a gate insulating film 12 is formed on the surface of the second silicon carbide semiconductor layer 11 by thermal oxidation.

Thereafter, as shown in FIG. 3(*c*), a polycrystalline silicon film 113 which is doped with about $7 \times 10^{20}$ $cm^{-3}$ of phosphorus is deposited on the surface of the gate insulating film 12. The polycrystalline silicon film 113 has a thickness of about 500 nm, for example.

Next, as shown in FIG. 3(*d*), by using a mask (not shown), partial regions of the polycrystalline silicon film 113 are removed by dry etching, thereby forming gate electrodes 13.

Then, as shown in FIG. 3(*e*), an interlevel dielectric film 14 of $SiO_2$ is deposited by a chemical vapor deposition (CVD) technique, so as to cover the surface of the gate electrodes 13 and the surface of the first silicon carbide semiconductor layer 6. The interlevel dielectric film 14 has a thickness of 1.5 μm, for example.

Next, as shown in FIG. 4(*a*), through dry etching by using a mask (not shown), the interlevel dielectric film 14 on the surface of each contact region 9 and a portion of the surface of each source region 8 is removed, thereby forming a via hole 114.

Thereafter, as shown in FIG. 4(*b*), a nickel film with a thickness of e.g. about 50 nm is formed on the interlevel dielectric film 14, and thereafter an etching is conducted to remove the nickel film except in the interior of each via hole 114 and a part of its surrounding. After the etching, in an inert ambient, a heat treatment is conducted at 950° C. for 5 minutes, for example, thereby allowing the nickel to react with the silicon carbide surface. Thus, source electrodes 10 of nickel silicide are formed. Nickel is also deposited on the entire back side 5*b* of the semiconductor substrate 5, and subjected to a similar heat treatment, thereby forming a drain electrode 16.

Then, as shown in FIG. 4(*c*), aluminum to become the upper interconnect 15 is deposited to a thickness of about 4 μm, over the interlevel dielectric film 14 and the via holes 114. By etching the upper interconnect 15 into a desired pattern, a main region source pad 2 and a sense region source pad 3 as shown in FIG. 1(*a*) are obtained. Although not shown, a gate line and a gate pad to be in contact with the gate electrodes are formed, so as to be electrically insulated from the main region source pad 2 and the sense region source pad 3. Furthermore, as a back side electrode 17 for die bonding purposes, Ti/Ni/Ag are deposited in this order on the drain electrode 16. In this manner, the semiconductor device 1 shown in FIG. 1 is obtained.

(Threshold Voltage and Onset Voltage Assessment of the Semiconductor Device)

A semiconductor device 1 according to the present embodiment was prototyped, and its electrical characteristics were assessed. In the prototyped semiconductor device 1, the body region 7 had an n type impurity concentration of $2 \times 10^{18}$ $cm^{-3}$, and the gate insulating film 12 had a film thickness of 70 nm. The second silicon carbide semiconductor layer 11 was structured so that an undoped layer with a film thickness of 75 nm was layered on an n type impurity layer having an n type impurity concentration of $1.1 \times 10^{18}$ $cm^{-3}$. In the prototyped semiconductor device 1, a ratio of the number of unit cells of the main region to that of the sense region was 34. A threshold voltage Vth in the forward direction and an onset voltage Vf in the reverse direction of the prototyped semiconductor device 1 were assessed by using a prober and a semiconductor parameter analyzer.

Figure 5:
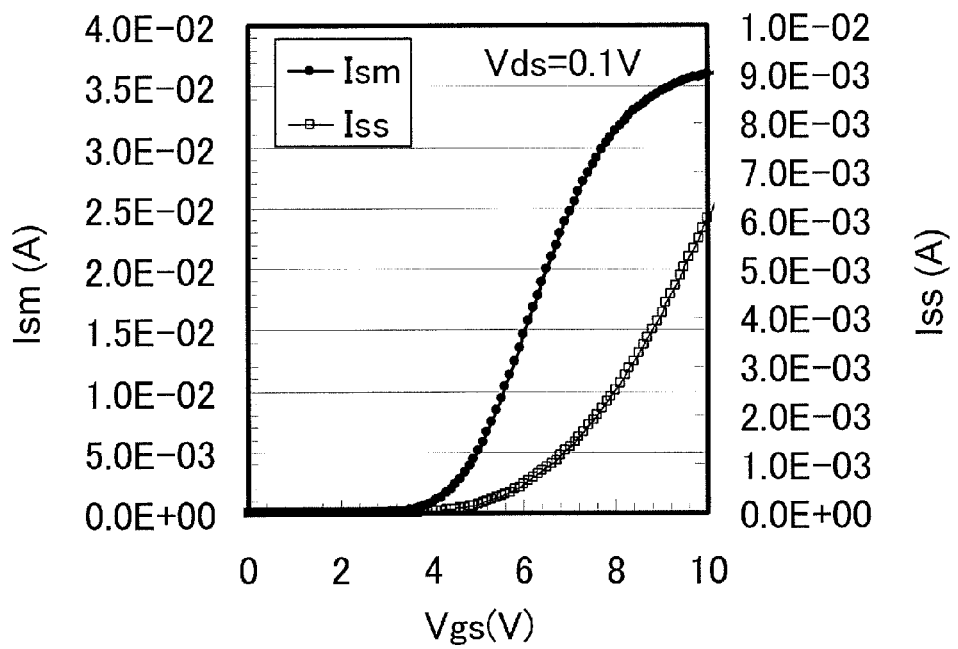
FIG. 5 A graph showing Is-Vgs curves of a semiconductor device according to the first embodiment of the present disclosure, in the forward direction.

First, in order to assess the threshold voltage of the prototyped semiconductor device 1 in the forward direction, Vds was set to 0.1 V, and Vgs was swept from 0 to 10 V, while the source currents (Ism, Iss) in the main region and the sense region were measured individually and simultaneously. FIG. 5 is a graph showing Iss-Vgs and Ism-Vgs curves of the prototyped semiconductor device 1 in the forward direction. In FIG. 5, the left vertical axis represents the source current Ism in the main region, whereas the right vertical axis represents the source current Iss in the sense region. In FIG. 5, data of black circles represents the source current in the main region, whereas data of white squares represents the source current in the sense region. The threshold voltage in the forward direction was determined from a Vgs of the time when a reference current was obtained. As the value of the reference current, different values were used between the main region and the sense region, in accordance with the cell number ratio. The reference current for the main region was 1 mA, and a value obtained by dividing this with the cell number ratio of 34, i.e., 0.029 mA, was adopted as the reference current for the sense region.

From measurements at room temperature, the threshold voltage of the main region was 4.05 V, and the threshold voltage of the sense region was 3.99 V, these values being substantially equal. Although threshold voltage has negative temperature characteristics, if there is a threshold voltage of 3 V or more at room temperature, a threshold voltage of about 1 V can be maintained even at 150° C. It was found from this result that the prototyped semiconductor device 1 is capable of normally-OFF operation in a range from room temperature to 150° C., and provides some noise margin.

Figure 6:
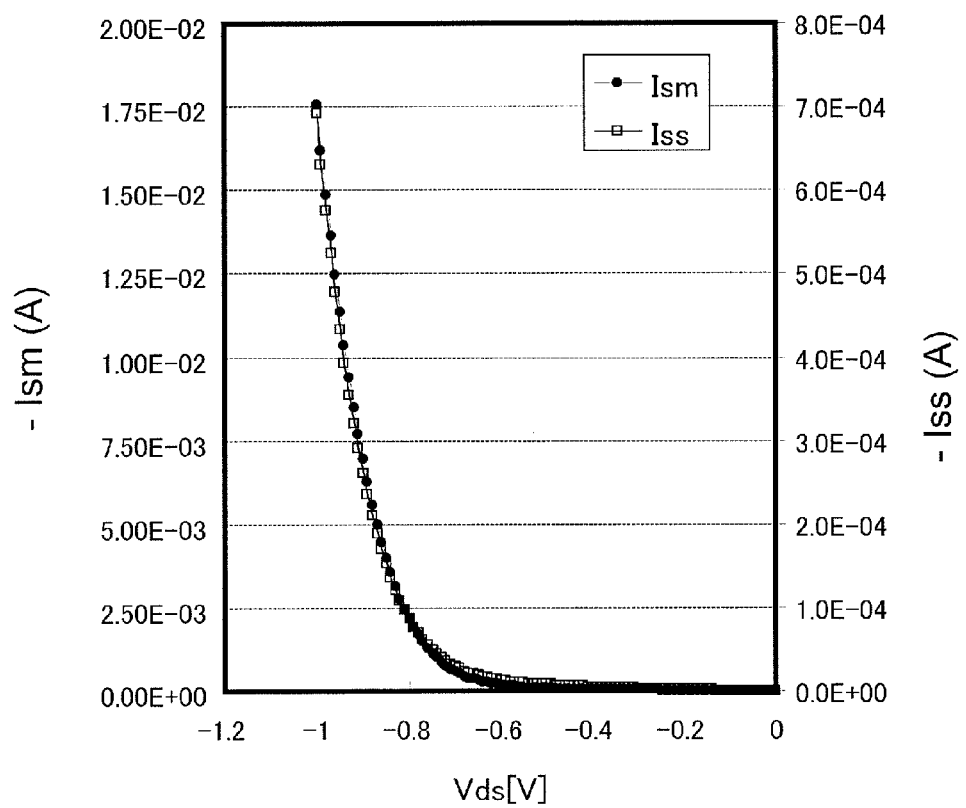
FIG. 6 A graph showing Is-Vds curves of a semiconductor device according to the first embodiment of the present disclosure, in the reverse direction.

Next, in order to assess the onset voltage of the prototyped semiconductor device 1 in the reverse direction, Vgs was fixed at 0 V, and Vds was swept from 0 to −1 V, while the source currents in the main region and the sense region (Ism, Iss) were measured individually and simultaneously. FIG. 6 is a graph showing Iss-Vds and Ism-Vds curves of the prototyped semiconductor device 1 in the reverse direction. In FIG. 6, the left vertical axis represents the source current −Ism in the main region, whereas the right vertical axis represents the source current −Iss in the sense region. In FIG. 6, data of black circles represents the source current in the main region, whereas data of white squares represents the source current in the sense region. The onset voltage in the reverse direction was determined from a Vds of the time when a reference current was obtained. The value of the reference current was −1 mA for the main region, and a value obtained by dividing this with the cell number ratio of 34, i.e., −0.029 mA, was adopted as the reference current for the sense region.

From measurements at room temperature, the onset voltage of the main region was −0.74 V, and the onset voltage of the sense region was −0.7 V, these values being substantially equal. The onset voltage of the body diode which is constituted by the body region 7 and the first silicon carbide semiconductor layer 6 is the value of built-in potential of a PN junction of silicon carbide, i.e., about 2.5 V; thus, it was found that the onset voltage of the prototyped semiconductor device 1 in the reverse direction attains a lower value than the onset voltage of the body diode. This result indicates that the reverse current is a result of a current flowing through the channel diode, i.e., from the source electrode 10, via the second silicon carbide semiconductor layer 11, and into the drain electrode 16, rather than through the body diode.

(Forward Current Assessment of the Semiconductor Device)

Figure 7:
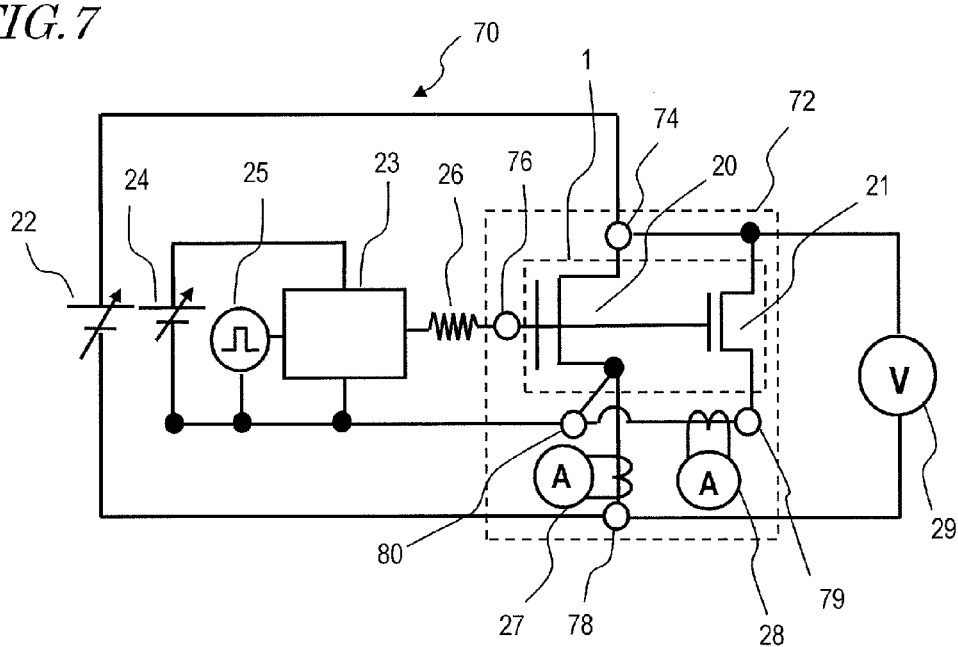
FIG. 7 A diagram showing the circuit construction of a measurement system for assessing a forward current of a semiconductor device according to the first embodiment of the present disclosure.

Next, the prototyped semiconductor device 1 was mounted on a substrate 72 having an electrode pattern formed thereon, and was subjected to assessment under a large current. FIG. 7 is a diagram showing the circuit construction of a measurement system 70 for assessing a forward current which simultaneously flows in the main region 20 and the sense region 21 of the semiconductor device 1 of the present embodiment. The substrate 72 having the semiconductor device 1 mounted thereon includes a drain terminal 74, a gate terminal 76, a main region source terminal 78, a sense region source terminal 79, and a Kelvin terminal 80. Vcc power 22 is provided in series connection between the drain terminal 74 and the main region source terminal 78. On the substrate, the main region source pad 2 of the main region 20 is connected to the main region source terminal 78 and the Kelvin terminal 80.

The current Ism flowing in the main region 20 (hereinafter abbreviated as the main region current Ism) flows from the main region source pad 2 to the main region source terminal 78, but not from the main region source pad 2 to the Kelvin terminal 80. The sense region source pad 3 of the sense region 21 is connected to the sense region source terminal 79. Connected to the Kelvin terminal 80. The gate pad 4 of the main region 20 and the sense region 21 is connected to the gate terminal 76.

The gate terminal 76 is connected to a gate driver 23 via a gate resistor 26. The potential of the Kelvin terminal 80 is used as the reference potential of the gate driver 23. Since only a small current from the sense region 21 flows to the Kelvin terminal 80, the Kelvin terminal 80 is at a substantially equal potential to the potential of the source electrode of the main region 20. Gate driver power 24 is connected to the gate driver 23. In accordance with the output from the pulse signal generator 25, a gate-source voltage which is determined by the voltage of gate driver power 24 is applied to both the main region 20 and the sense region 21.

A low current probe 28 is provided between the sense region source pad 3 of the sense region 21 and the Kelvin terminal, and measures the current Iss flowing in the sense region 21 (hereinafter abbreviated as the sense region current Iss). The sense region current Iss passes through the Kelvin terminal 80, and thereafter meets with the main region current Ism to together flow to the main region source terminal 78. A high current probe 27 is provided between the main region source pad 2 and the main region source terminal 78, and measures a sum of the sense region current Iss and the main region current Ism. A voltmeter 29 monitors the voltage between the drain terminal 74 and the source terminal 78.

Figure 8:
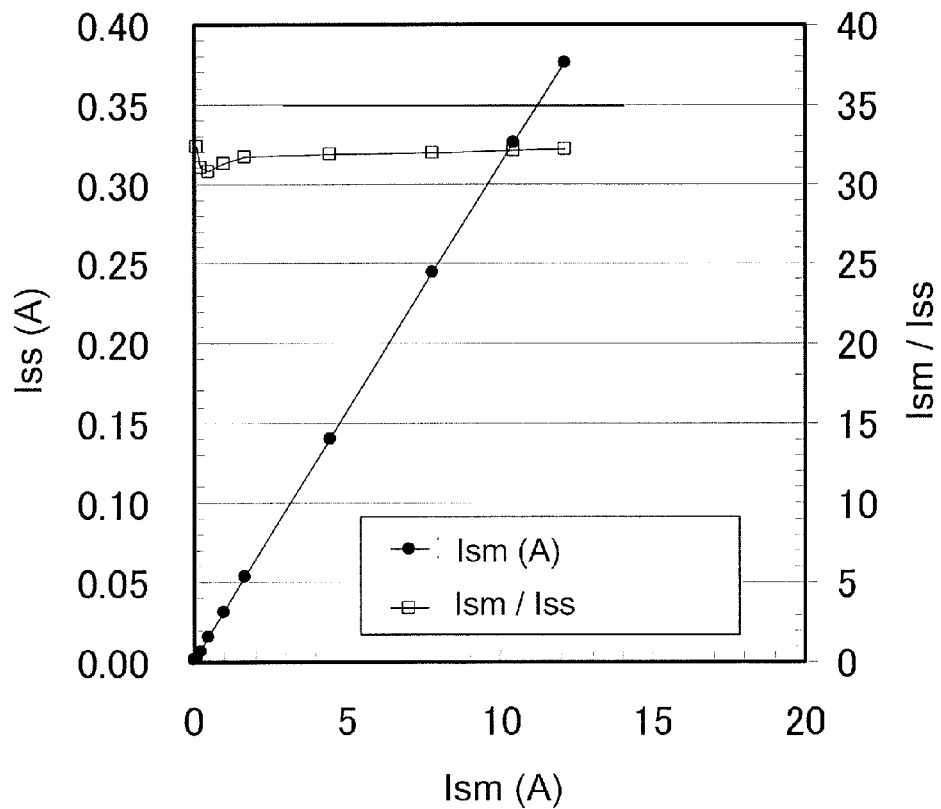
FIG. 8 A graph showing a result of assessing a forward current of a semiconductor device according to the first embodiment of the present disclosure at an ambient temperature of 25° C.

FIG. 8 is a graph showing a result of assessing the forward current of the semiconductor device 1 at an ambient temperature Ta of 25° C. In FIG. 8, the horizontal axis represents the main region current Ism, the left vertical axis represents the sense region current Iss, and the right vertical axis represents a ratio Ism/Iss of the main region current Ism to the sense region current Iss. In FIG. 8, data indicated by black circles represents the sense region current Iss, whereas data indicated by white squares represents a ratio Ism/Iss of the main region current Ism to the sense region current Iss. It can be seen from FIG. 8 that the sense region current Iss is in proportion to the main region current Ism. The ratio of the main region current Ism to the sense region current Iss is about 32, which is substantially equal to the cell number ratio of 34.

Figure 9:
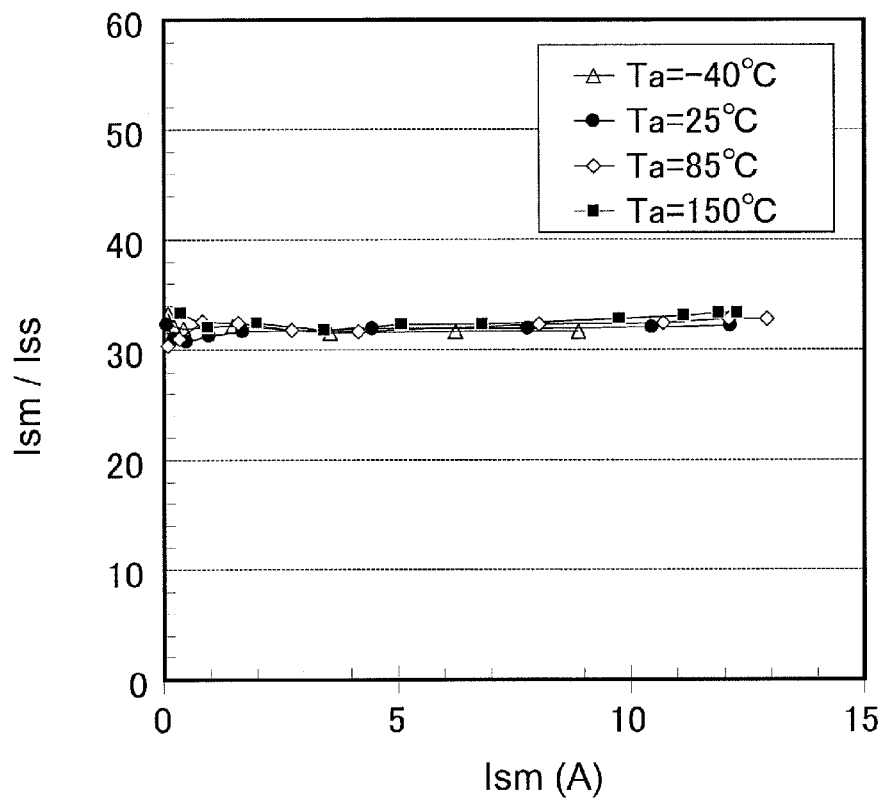
FIG. 9 A graph showing a result of assessing a forward current of a semiconductor device according to the first embodiment of the present disclosure at ambient temperatures of −40° C., 25° C., 85° C., and 150° C.

FIG. 9 is a graph showing a result of assessing the forward current of the semiconductor device 1 at ambient temperatures Ta of −40° C., 25° C., 85° C., and 150° C. In FIG. 9, the horizontal axis represents the main region current Ism, and the vertical axis represents the ratio of the main region current Ism to the sense region current Iss. As can be seen from FIG. 9, in a range of ambient temperatures Ta from −40° C. to 150° C., the ratio of the main region current Ism to the sense region current Iss was substantially constant, regardless of the magnitude of the sense region current Iss. The ratio of the main region current Ism to the sense region current Iss had a mean value of 32.2, which is substantially equal to the cell number ratio. The ratio of the main region current Ism to the sense region current Iss had a minimum value of 30.8 and a maximum value of 33.5, with a mean absolute deviation as small as 1.7%. A mean absolute deviation is defined as in eq. (3) below.

[math. 2]
$$\frac{1}{n}\sum |x - \bar{x}| \quad (3)$$

(Reverse Current Assessment of the Semiconductor Device)

Figure 10:
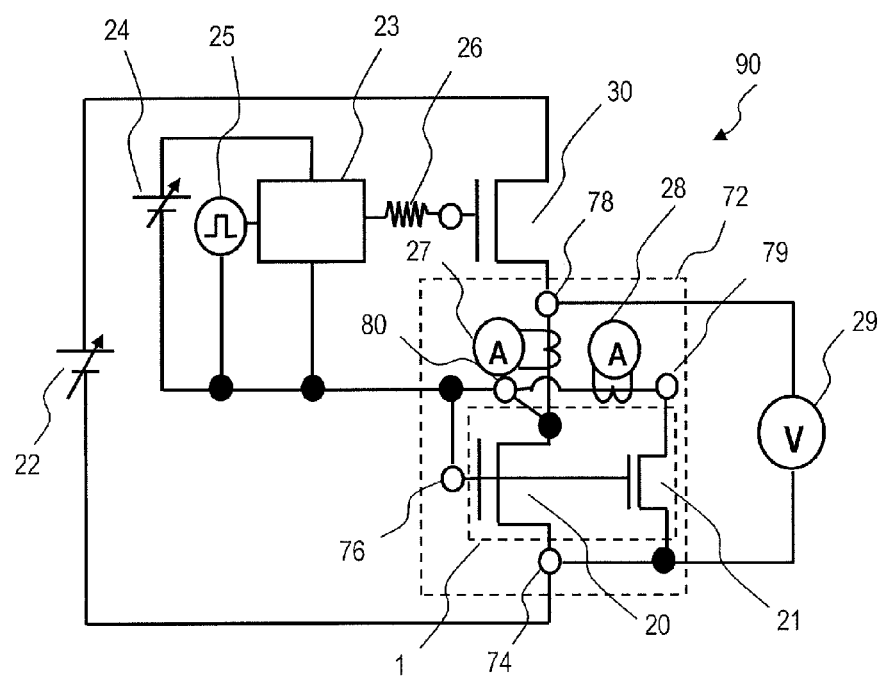
FIG. 10 A diagram showing the circuit construction of a measurement system for assessing a reverse current of a semiconductor device according to the first embodiment of the present disclosure.

Next, the prototyped semiconductor device 1 was subjected to a reverse current assessment. FIG. 10 is a diagram showing the circuit construction of a measurement system 90 for assessing a reverse current which simultaneously flows in the main region 20 and the sense region 21 of the semiconductor device 1 of the present embodiment.

The semiconductor device 1 and a switching FET 30 are in series connection. Note that the semiconductor device 1 and the switching FET 30 are connected in reverse directions. In other words, the main region source terminal 78 of the substrate 72 having the semiconductor device 1 mounted thereon is connected to the source electrode of the switching FET 30. The positive terminal of Vcc power 22 is connected to the drain electrode of the switching FET 30, and the negative terminal of Vcc power 22 is connected to the drain terminal 74 of the substrate 72. Since the gate terminal 76 of the substrate 72 is connected to the Kelvin terminal 80, Vgs is fixed at 0 V. The gate electrode of the switching FET 30 is connected to the gate driver 23 via the gate resistor 26. Gate driver power 24 is connected to the gate driver 23, and each reference potential terminal is connected to the Kelvin terminal 80.

With an output from the pulse signal generator 25, the gate driver 23 outputs a gate voltage which is determined by the voltage of gate driver power to the switching FET 30. It is only at moments when the switching FET 30 conducts that a reverse voltage resulting from subtracting the potential drop of the switching FET 30 from the output voltage of Vcc power 22 is applied between the drain terminal 74 and the main region source terminal 78 of the substrate 72, whereby a reverse current flows.

The current flowing through the switching FET 30 passes through the main region source terminal 78, and thereafter at the main region source pad 2, splits into a main region current −Ism in the reverse direction and a sense region current −Iss in the reverse direction. From the main region source pad 2, a sense region current −Iss in the reverse direction passes through the Kelvin terminal 80, and flows in the sense region 21. The low current probe 28 is disposed between the sense region source pad 3 of the sense region 21 and the Kelvin terminal 80, and measures the sense region current −Iss in the reverse direction. The high current probe 27 is disposed between the main region source pad 2 and the main region source terminal 78, and measures a sum of the sense region current −Iss in the reverse direction and the main region current −Ism in the reverse direction. The voltmeter 29 monitors the voltage between the drain terminal 74 and the main region source terminal 78.

With the measurement system 90 shown in FIG. 10, by setting Vgs of the semiconductor device 1 at 0 V and varying the output voltage of Vcc power 22, the sense region current −Iss in the reverse direction was measured in a range where the main region current −Ism in the reverse direction was 0 to 40 A.

Figure 11:
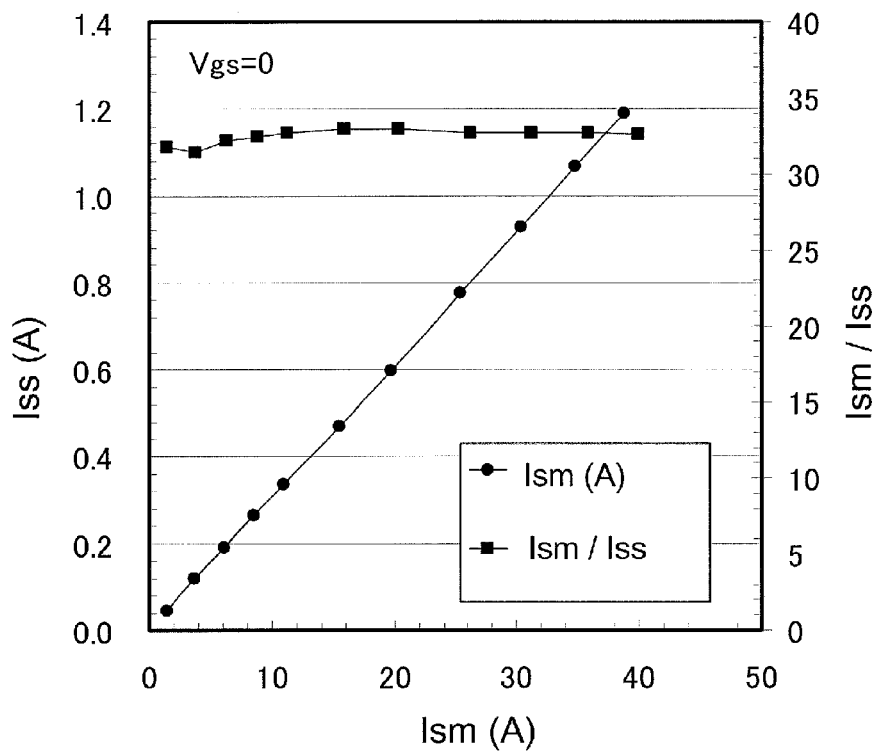
FIG. 11 A graph showing a result of assessing a reverse current of a semiconductor device according to the first embodiment of the present disclosure at an ambient temperature of 25° C.

FIG. 11 is a graph showing a result of assessing the reverse current of the semiconductor device 1 at an ambient temperature Ta of 25° C. In FIG. 11, the horizontal axis represents the main region current −Ism in the reverse direction, the left vertical axis represents the sense region current −Iss in the reverse direction, and the right vertical axis represents a ratio Ism/Iss of the main region current −Ism in the reverse direction to the sense region current −Iss in the reverse direction. In FIG. 11, data indicated by black circles represents the sense region current −Iss in the reverse direction, whereas data indicated by black squares represents the ratio Ism/Iss of the main region current −Ism in the reverse direction to the sense region current −Iss in the reverse direction. It can be seen from FIG. 11 that the sense region current −Iss is in proportion to the main region current −Ism, also in the reverse direction. The ratio of the main region current −Ism in the reverse direction to the sense region current −Iss in the reverse direction was about 32, which is substantially equal to the cell number ratio of 34, as was the case in the forward direction.

Figure 12:
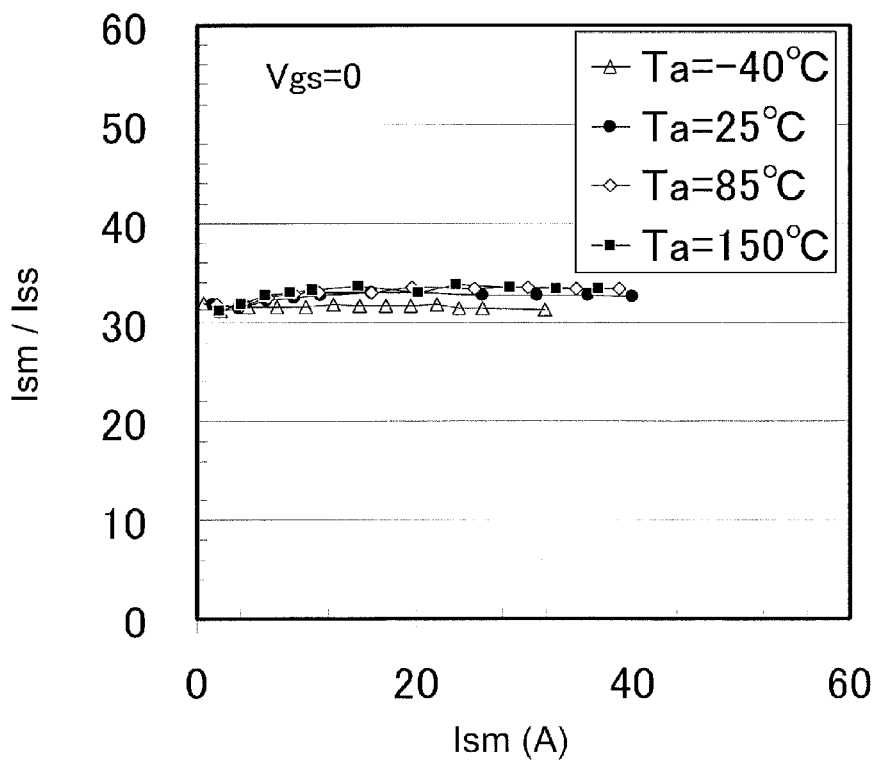
FIG. 12 A graph showing a result of assessing a reverse current of a semiconductor device according to the first embodiment of the present disclosure at ambient temperatures of −40° C., 25° C., 85° C., and 150° C.

FIG. 12 is a graph showing a result of assessing the reverse current of the semiconductor device 1 at ambient temperatures Ta of −40, 25° C., 85° C., and 150° C. In FIG. 12, the horizontal axis represents the main region current −Ism in the reverse direction, and the vertical axis represents the ratio Ism/Iss of the main region current −Ism in the reverse direction to the sense region current −Iss in the reverse direction. As can be seen from FIG. 12, in a range of ambient temperatures Ta from −40° C. to 150° C., the ratio of the main region current −Ism in the reverse direction to the sense region current −Iss in the reverse direction was substantially constant, regardless of the magnitude of the sense region current −Iss in the reverse direction. The ratio of the main region current −Ism in the reverse direction to the sense region current −Iss in the reverse direction had a mean value 32.4, which is substantially equal to the ratio of the main region current Ism to the sense region current Iss in the forward direction. The ratio of the main region current −Ism in the reverse direction to the sense region current −Iss in the reverse direction had a minimum value of 31.1, and a maximum value of 33.8, with a mean absolute deviation as small as 2.3%.

As described above, the semiconductor device which is disclosed in the present specification functions as a diode which has a high threshold voltage Vth in the forward direction, and an onset voltage Vf of less than 1 V in the reverse direction. In the semiconductor device which is disclosed in the present specification, the ratio between the current flowing in the main region and the current flowing in the sense region is constant in a broad current range and a broad temperature range, and in both of the forward direction and the reverse direction, satisfying the relationship of eq. (1). Therefore, with the semiconductor device which is disclosed in the present specification, by measuring a small current flowing in the sense region, a large current flowing in the main region can be detected with a high accuracy.

Note that, without being limited to the aforementioned values, the ratio of the number of cells in the main region to that in the sense region may be greater. However, when the sense region current Iss is 100 mA or less, an advantage is obtained in that inexpensive generic operational amplifiers can be used to handle the sense region current Iss, enabling current detection with a simple current-voltage conversion circuit by using a generic operational amplifier.

Figure 13:
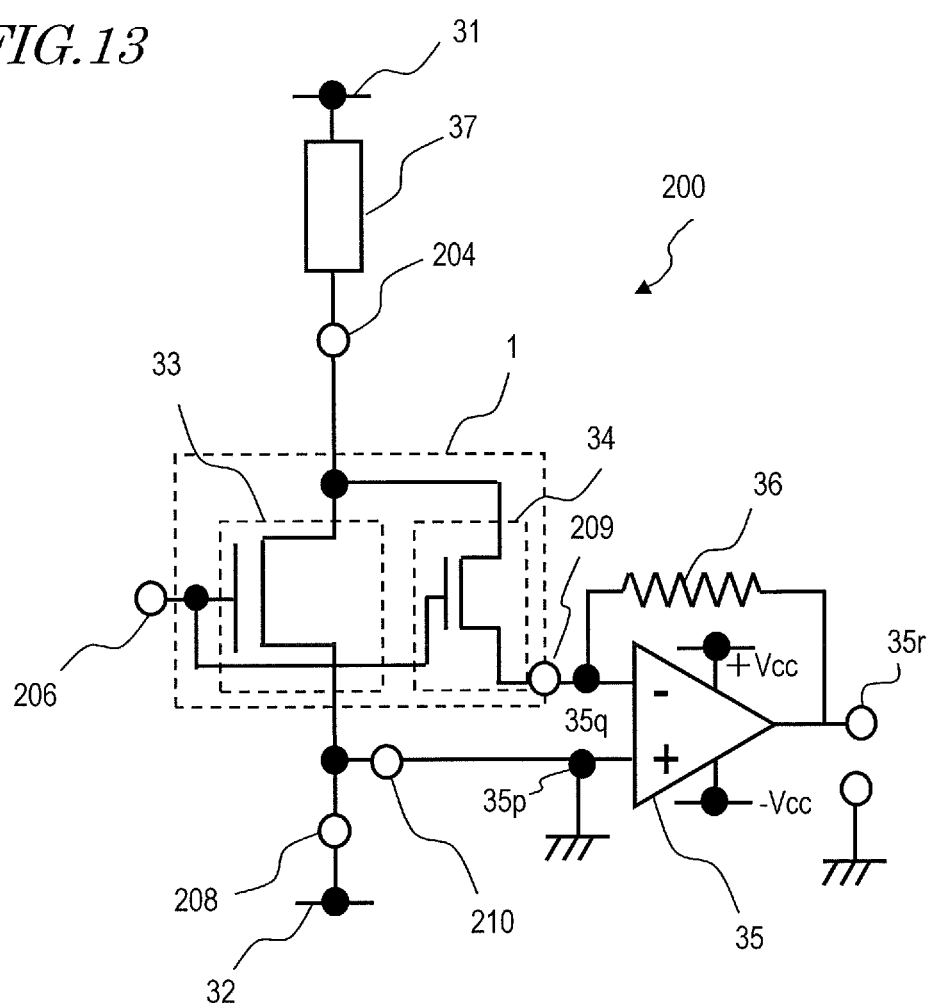
FIG. 13 A diagram showing the circuit construction of a measurement system for measuring a forward current and a reverse current of a semiconductor device according to the first embodiment of the present disclosure incorporating a current-voltage conversion circuit which includes an operational amplifier.

FIG. 13 is a diagram showing the circuit construction of a measurement system 200 for measuring a forward current and a reverse current of the semiconductor device of the present embodiment, incorporating a current-voltage conversion circuit which includes an operational amplifier. The measurement system 200 includes an operational amplifier 35 having a non-inverting input terminal 35$p$, an inverting input terminal 35$q$, and an output terminal 35$r$.

The drain electrode in the main region 33 and the sense region 34 of the semiconductor device 1 is connected to one end of a load 37 via a drain terminal 204. The other end of the load 37 is connected to a Vdd power line 31. The source electrode of the main region 33 is connected to a return line 32 of Vdd power, via a main region source terminal 208.

Moreover, a Kelvin terminal 210, which branches out from the source electrode of the main region 33, is connected to the non-inverting input terminal 35$p$ of the operational amplifier 35. The source electrode of the sense region 34 is connected to the inverting input terminal 35$q$ of the operational amplifier 35 via a sense region source terminal 209. The current flowing in the load 37 is split into a current Ism flowing in the main region 33 and a current Iss flowing in the sense region 34. Since the operational amplifier 35 has a very large input impedance, the current Ism flowing in the main region 33 and the current Iss flowing in the sense region 34 do not flow into the non-inverting input terminal 35$p$ and the inverting input terminal 35$q$ of the operational amplifier 35. Since the current Ism flowing in the main region 33 does not flow into the Kelvin terminal 210, the Kelvin terminal 210 is not affected by a potential drop associated with the current Ism flowing in the main region 33. Therefore, the potential of the Kelvin terminal 210, i.e., the potential of the non-inverting input terminal 35$p$ of the operational amplifier 35, accurately equals the potential of the main region source pad 2 of the main region 33. A sense resistor 36 is connected between the output terminal 35$r$ and the inverting input terminal of the operational amplifier 35. The gate electrodes in the main region 20 and the sense region 21 are connected to a gate terminal 206.

The gain of the operational amplifier 35 is ideally infinite, and is very large in actuality. If the potentials of the inverting input terminal 35$q$ and the non-inverting input terminal 35$p$ are different, a potential which is in proportion to that difference will appear at the output terminal 35$r$, which results in a negative feedback that decreases the potential of the inverting input terminal 35$q$ via the sense resistor 36. This consequently equalizes the potential of the inverting input terminal 35$q$ with the potential of the non-inverting input terminal 35$p$. As a result, the potentials of the source electrodes of the main region 33 and the sense region 34 become equal, so that equal gate-source voltages are applied to both the main region 33 and the sense region 34. In order to further stabilize the negative feedback, the sense resistor 36 preferably has a resistance value on the order of kΩ.

The output Vsense of the operational amplifier 35 is expressed by following equation.

$$V\text{sense} = -I_{ss} \times R\text{sense} \qquad (4)$$

Herein, Iss is the current flowing in the sense region 34, and Rsense is the resistance value of the sense resistor 36. The right-hand side of the above equation takes a negative value when the current flowing in the sense region 34 is a so-called forward current that flows from the drain to the source, and takes a positive value when it is a so-called reverse current that flows from the source to the drain.

Generally speaking, operational amplifiers are classified into a single supply type, which only applies power voltage of a single polarity, and a dual supply type, which applies power voltage of both positive polarity and negative polarity. In the case of a single supply type, the output can only take either positive or negative polarity. In the case of a dual supply type, the output can take both polarities of positive and negative. Therefore, in order to measure the forward current and the reverse current, it is preferable to use an operational amplifier of a dual supply type. That is, a dual supply type is preferably used for the operational amplifier 35.

An operational amplifier cannot output any voltage that exceeds the power voltage. The power voltage of many a generic operational amplifier is 12 to 15 V. When the sense resistor is on the kΩ order, the current which can be allowed to flow in the operational amplifier is on the order of 100 mA or less. In the present embodiment, the negative feedback of the operational amplifier was not stable when the sense resistor was less than 100Ω.

Note that it is not necessary to use an operational amplifier for the current-voltage conversion circuit. Instead of an operational amplifier, for example, a current sensor which utilizes the Hall effect, or a current sensor such as a Rogowski coil, can be used for the current-voltage conversion circuit.

Furthermore, with the semiconductor device which is disclosed in the present specification, if a detected reverse current value is not the desired value, it is possible to control the magnitude of the reverse current by controlling the gate voltage.

Figure 14:
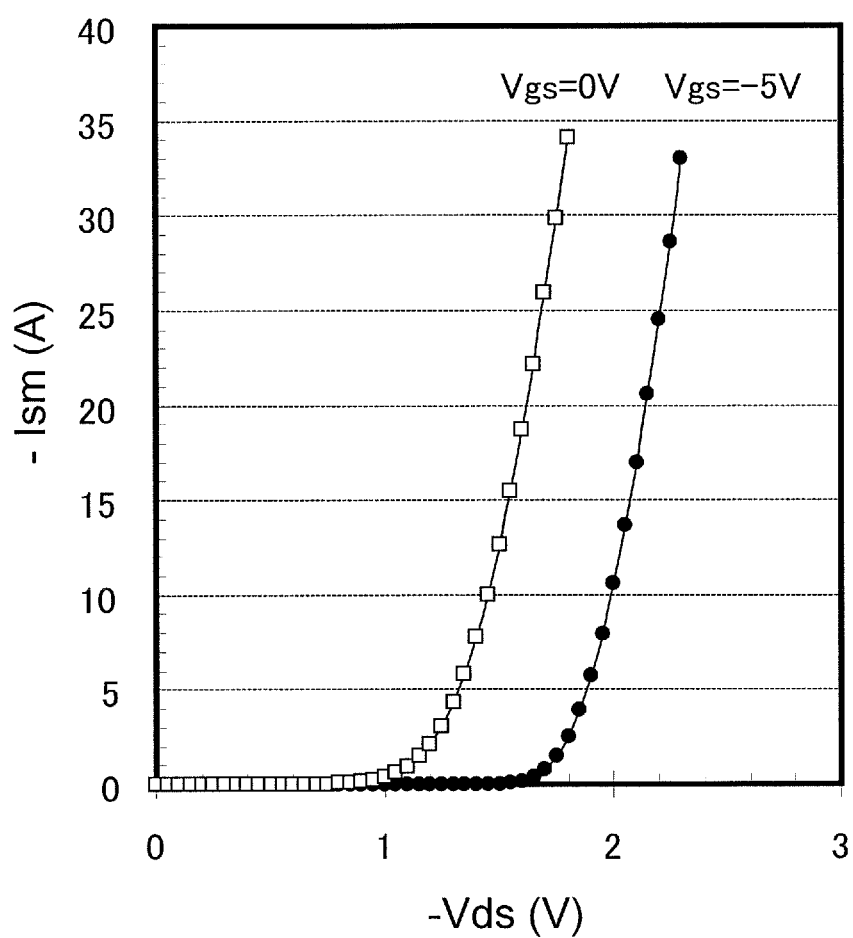
FIG. 14 A graph showing gate voltage dependence of a reverse-direction Ism-Vds curve, of the main region of a semiconductor device according to the first embodiment of the present disclosure.

FIG. 14 is a graph showing gate voltage dependence of the reverse-direction Ism-Vds curve of the main region of the semiconductor device 1 of the present embodiment. In FIG. 14, the horizontal axis represents the drain voltage −Vds in the negative direction, and the vertical axis represents the reverse current −Ism flowing in the main region. In FIG. 14, data indicated by white squares represents data when Vgs is 0 V, whereas data indicated by black circles represents data when Vgs is −5 V. As can be seen from FIG. 14, in the semiconductor device 1, the reverse current flowing in the main region can be reduced by making the gate voltage more negative. In the graph shown in FIG. 14, at Vgs=0 V, −Vds is 1.5 V when −Is is 15 A, thus resulting in a resistance of 0.1Ω. On the other hand, at Vgs=−5 V, −Vds is 2 V when −Is is 15 A, hence increasing the resistance to 0.13Ω. Thus, in the semiconductor device of the present specification, the reverse current also flows through the channel of the transistor, so that its IV characteristics can be altered based on gate voltage. In the technique disclosed in Patent Document 1, the reverse current flows through the body diode, so that the IV characteristics in the reverse direction cannot be altered based on gate voltage.

In the technique disclosed in Patent Document 1, in order to detect a current flowing in a free-wheel diode, it is necessary to provide a diode current detection means in addition to a transistor current detection means, thus resulting in a complicated construction.

On the other hand, in the semiconductor device which is disclosed in the present specification, the sense region is utilized to detect not only the forward current, which corresponds to a transistor current, but also the reverse current, which corresponds to a diode current. Therefore, in the semiconductor device which is disclosed in the present specification, both a current flowing through the transistor and a current flowing through the free-wheel diode can be detected with a simple construction.

Moreover, Patent Document 1 discloses detection of a reverse current flowing in the body diode of the low-side MOSFET in a conventional switching circuit. However, in the switching circuit described in Patent Document 1, it is not possible to control the reverse current based on gate voltage. Moreover, in the case of a silicon carbide semiconductor, when a current is flowed in the PN junction constituting the body diode, stacking faults will grow to deteriorate the characteristics of the body diode. Moreover, since a silicon carbide semiconductor has a wide band gap, the onset voltage Vf of the body diode will be as large as about 2.5 V.

On the other hand, in the semiconductor device which is disclosed in the present specification, the reverse current is detected by using the channel diode, rather than the body diode, so that characteristics deterioration due to growing stacking faults does not occur, and the onset voltage Vf of the diode is low. Furthermore, the semiconductor device which is disclosed in the present specification provides a unique effect of being able to control the reverse current based on gate voltage.

Second Embodiment

Structure of the Semiconductor Device

Next, a semiconductor device according to a second embodiment of the present disclosure will be described with reference to the drawings. FIG. 15(a) is a plan view generally showing the semiconductor device of the present embodiment. FIG. 15(b) is a cross-sectional view generally showing portion A-A' in FIG. 15(a). FIG. 15(c) is a cross-sectional view generally showing a unit cell in FIG. 15(b). FIG. 15(d) is a cross-sectional view showing enlarged the boundary between the main region 320 and the region 321 in FIG. 15(b).

In the semiconductor device 1 of the first embodiment, the unit cell 111 is a planar-gate type MISFET; the semiconductor device of the present embodiment 301 differs in that the unit cell 311 is a trench-gate type MISFET. Constituent elements which are common to those of the semiconductor device 1 of the first embodiment will be denoted by like numerals, and the descriptions thereof will be omitted.

As shown in FIG. 15(b), the semiconductor device 301 has a sense region 321 and a main region 320. The sense region 321 and the main region 320 each include a plurality of unit cells 311, which are in parallel connection with one another.

As shown in FIG. 15(b), in a first silicon carbide semiconductor layer 6 of a first conductivity type at the boundary between the sense region 321 and the main region 320, unlike in unit cells, edge termination base regions 18 and 19 and an element isolation region 110 are provided. The edge termination base regions 18 and 19 and the element isolation region 110 are both of a second conductivity type. The edge termination base regions 18 and 19 do not include any source region of the first conductivity type because, if any source region were provided in the edge termination base regions 18 and 19, a large current might flow in a parasitic bipolar which is composed of the source region, the edge termination base regions 18 and 19, and the first silicon carbide semiconductor layer 6, thus possibly destroying the semiconductor device 301. A source electrode 10 is provided on the edge termination base regions 18 and 19, so as to be electrically connected with source electrodes 10 of the unit cells 311 via the upper interconnects 15. Therefore, the edge termination base regions 18 and 19 and the source regions 8 of the unit cells 311 are at the same potential. The edge termination base regions 18 and 19 constitute a PN diode with the first silicon carbide semiconductor layer 6.

The element isolation region 110 is located between the edge termination base region 18 and the edge termination base region 19. No source electrode 10 is provided on the element isolation region 110, so that the potential of the element isolation region 110 is a floating potential. The element isolation region 110 prevents a current from flowing between the sense region 321 and the main region 320. As shown in FIG. 15(d), no second silicon carbide semiconductor layer 11 is provided on the element isolation region 110 or at edge portions of the edge termination base regions 18 and 19. This prevents a current from flowing between the main region 320 and the sense region 321 via the second silicon carbide semiconductor layer 11, thus allowing a current flowing in the sense region 321 to be detected in a distinguishable manner over a current flowing in the main region 320.

With reference to FIG. 15(c), the structure of the unit cell 311 will be described. A trench 112 extends from the surface layer of the source region 8 to penetrate through the source region 8 and the body region 7. The second silicon carbide semiconductor layer 11 is on the side face and the bottom face of the trench 112 and a portion of the surface of the source region 8. The second silicon carbide semiconductor layer 11 is an epitaxial layer which is formed by epitaxial growth so as to cover the bottom face and side face of the trench 112 of the first silicon carbide semiconductor layer 6 and the periphery of the trench 112, for example. In the case where the second silicon carbide semiconductor layer 11 is composed of a single n type layer, the thickness of the second silicon carbide semiconductor layer 11 may be 75 nm or less, and the doping concentration of an n type impurity in the second silicon carbide semiconductor layer 11 may be $1 \times 10^{18}$ cm$^{-3}$ or more, for example. The second silicon carbide semiconductor layer 11 may also be a layer obtained by stacking an undoped layer on the surface of an n type impurity layer. In some cases, the film thickness of the second silicon carbide semiconductor layer 11 may become reduced during the steps of sacrificial oxidation and gate oxidation. Variation in the decrease in film thickness of the second silicon carbide semiconductor layer 11 during production steps causes variation in the electrical characteristics of the semiconductor device 301, e.g., threshold voltage in the forward direction and onset voltage in the reverse direction. By stacking an undoped layer on the surface of the n type impurity layer, variation in the electrical characteristics of the semiconductor device 301 can be reduced.

A gate insulating film 12 is provided on the second silicon carbide semiconductor layer 11. The gate insulating film 12 has a thickness of about 70 nm.

On the gate insulating film 12, a gate electrode 13 is provided so as to bury the trench 112. For example, the gate electrode 13 is an n type poly-Si doped with about $1 \times 10^{21}$ cm$^{-3}$ of phosphorus, and the gate electrode 13 has a thickness of about 500 nm.

In the case of a trench-gate type MISFET, a channel is formed not in a parallel direction to the principal face of the semiconductor substrate, but in the thickness direction of the semiconductor substrate; therefore, the area density of the channel can be increased relative to a planar-gate type MISFET. Therefore, given a semiconductor device of the same size, a trench-gate type MISFET can increase the current to flow, as compared to a planar-gate type MISFET. Current measurement becomes more difficult as the current increases; therefore, when the unit cell in the semiconductor device which is disclosed in the present specification is a trench-gate type MISFET, the effect associated with current measurement becomes more pronounced, due to a current flowing in the sense region, whose number of cells is made smaller than that of the main region.

(Method of Producing the Semiconductor Device)

Figure 17:
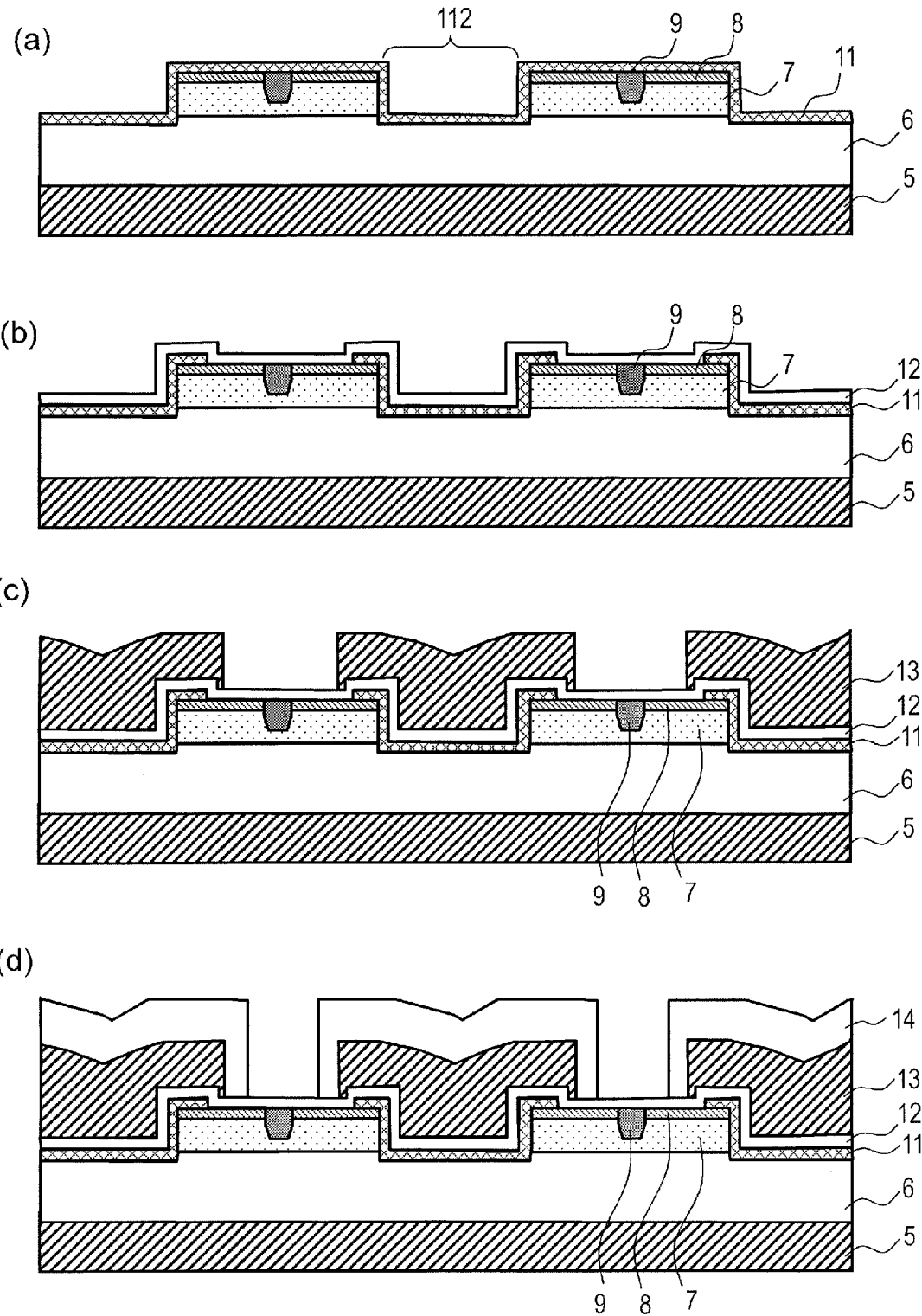
FIG. 17 A cross-sectional view partially showing a method of producing a semiconductor device according to the second embodiment of the present disclosure.
Figure 18:
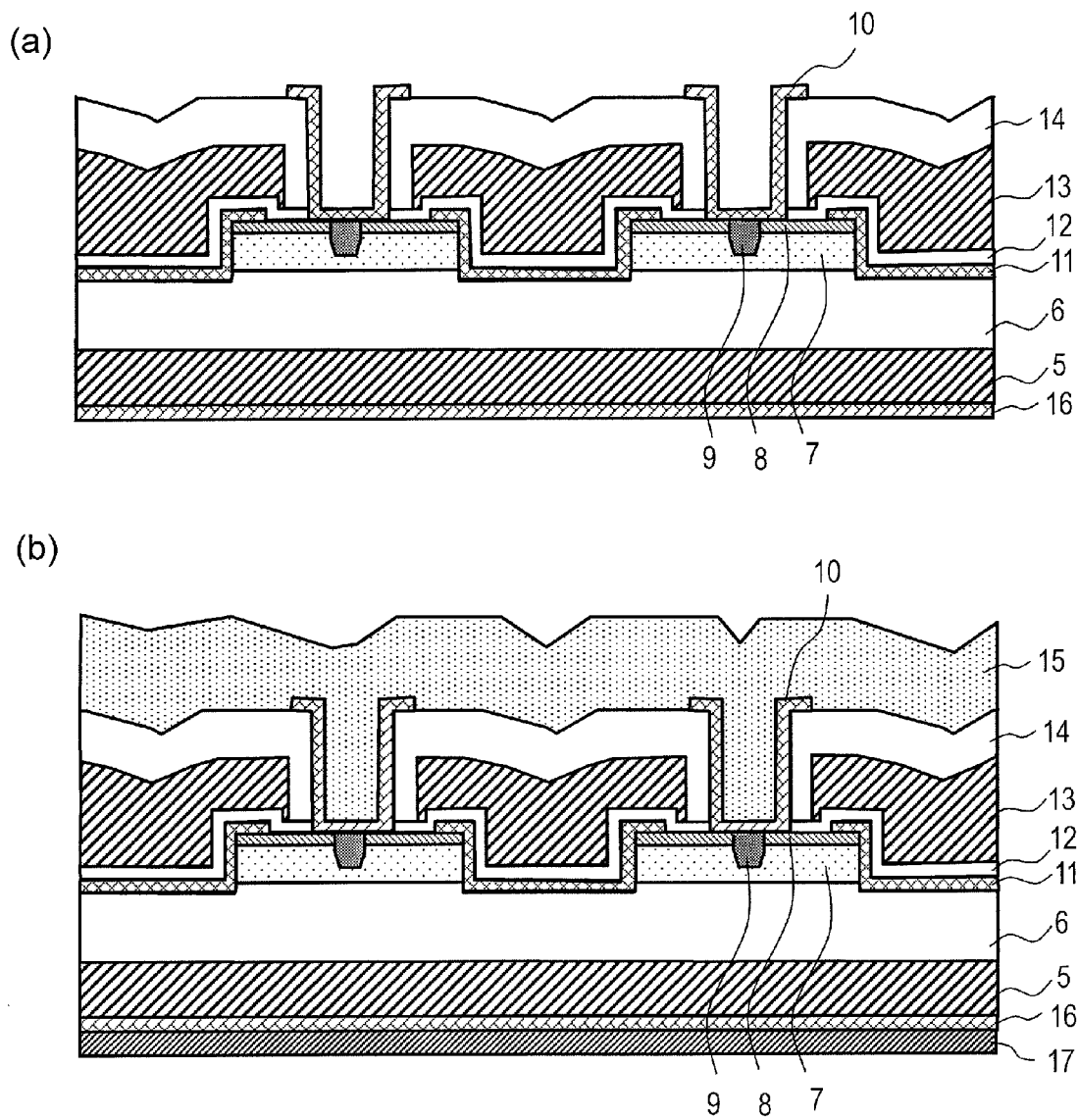
FIG. 18 A cross-sectional view partially showing a method of producing a semiconductor device according to the second embodiment of the present disclosure.

Next, with reference to FIG. 16 to FIG. 18, a method of producing the semiconductor device of the present embodiment will be described. FIG. 16 to FIG. 18 are cross-sectional views showing a method of producing the semiconductor device of the present embodiment.

The step of providing the semiconductor substrate 5 shown in FIG. 16(a) and the step of epitaxially growing the first silicon carbide semiconductor layer 6 shown in FIG. 16(b) are identical to the steps shown in FIG. 2(a) and FIG. 2(b) of the first embodiment, and the descriptions thereof are omitted.

Next, as shown in FIG. 16(c), on the surface of the first silicon carbide semiconductor layer 6, for example, a body region 7 having a thickness of about 0.5 μm to about 1 μm is epitaxially grown. Instead of epitaxial growth, aluminum ions or boron ions may be implanted into the first silicon carbide semiconductor layer 6 to form the body region 7.

Then, as shown in FIG. 16(d), on the surface of the body region 7, through nitrogen ion implantation or epitaxial growth, a source region 8 containing a high concentration of an n type impurity is formed. In addition, Al ions are implanted into the source region 8 by using a mask (not shown), thereby forming p type contact regions 9 that reach the body region 7. Thereafter, an activation annealing is conducted. The activation annealing is performed in an inert ambient at about 1700 to about 1800° C. for about 30 minutes, for example.

Next, as shown in FIG. 16(e), partial regions of the source region 8 and the body region 7 are removed by dry etching by using a mask (not shown), thereby forming trenches 112 in desired regions. Each trench 112 is a recess that penetrates through the source region 8 and the body region 7 to reach the first silicon carbide semiconductor layer 6.

Next, as shown in FIG. 17(a), on the entire surface of the first silicon carbide semiconductor layer 6 including the bottom face and the side face of each trench 112, a second silicon carbide semiconductor layer 11 is epitaxially grown.

Next, as shown in FIG. 17(b), partial regions of the second silicon carbide semiconductor layer 11 are removed by dry etching, so as to expose a portion of each source region 8 and the surface of the contact region 9. Thereafter, through thermal oxidation, a gate insulating film 12 is formed on the surface of the second silicon carbide semiconductor layer 11.

Next, as shown in FIG. 17(c), on the surface of the gate insulating film 12, a polycrystalline silicon film having a thickness of about 500 nm and being doped with about $7 \times 10^{20}$ cm$^{-3}$ of phosphorus is deposited, for example. Next, the polycrystalline silicon film is worked into a desired pattern through dry etching, thereby forming a gate electrode 13 within each trench 112 and in a partial region around the trench 112.

The step of depositing the interlevel dielectric film 14 shown in FIG. 17(d), the step of forming the source electrode 10 and the drain electrode 16 shown in FIG. 18(a), and the step of forming the upper interconnect 15 and the back side electrode 17 shown in FIG. 18(b) are identical to the steps shown in FIG. 3(e), FIG. 4(a), FIG. 4(b), and FIG. 4(c) of the first embodiment, and the descriptions thereof are omitted.

Figure 15:
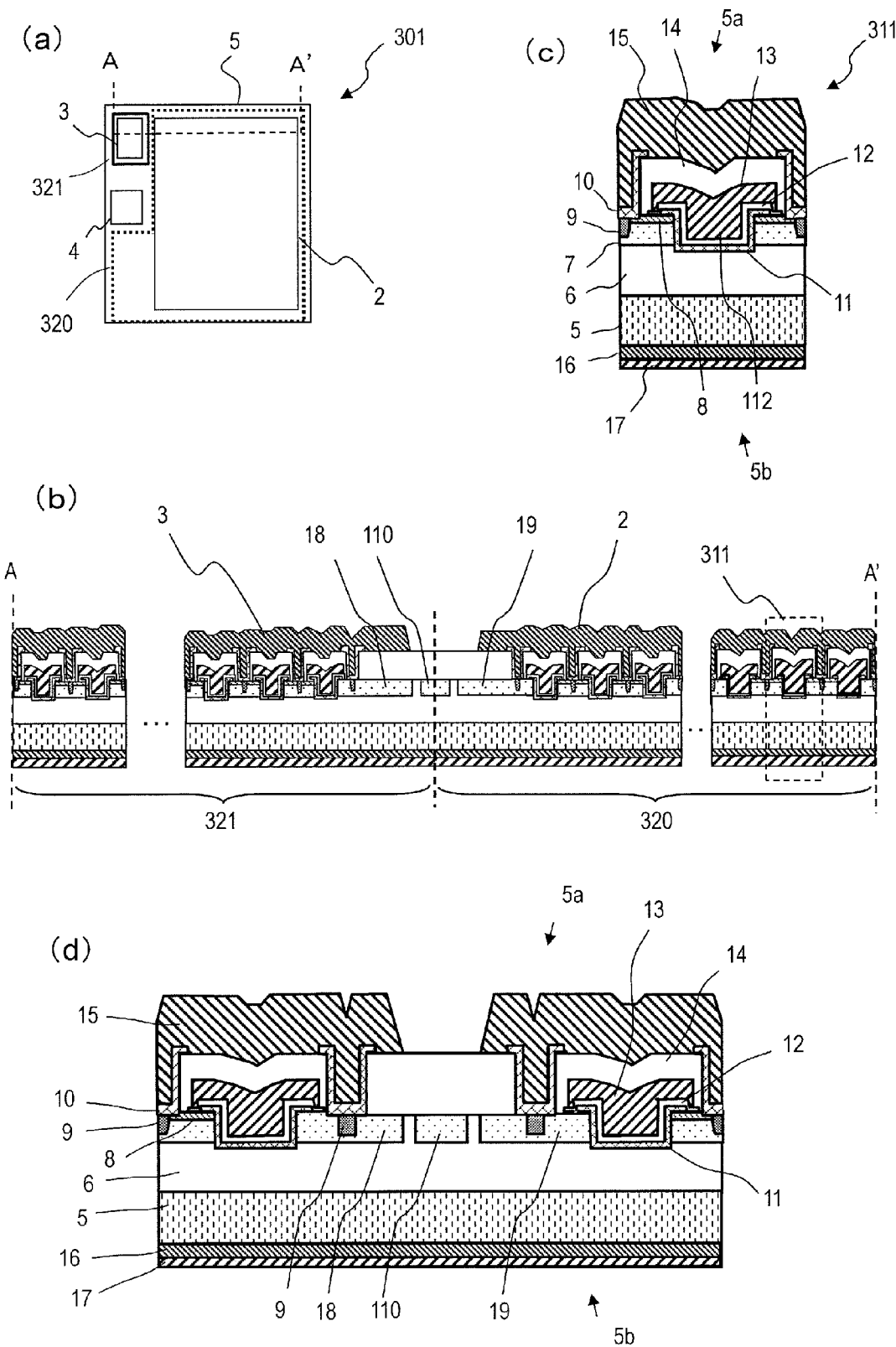
FIG. 15 (a) is a plan view generally showing a semiconductor device according to a second embodiment of the present disclosure; (b) is a cross-sectional view generally showing portion A-A' in (a); (c) is a cross-sectional view generally showing a unit cell of this semiconductor device; and (d) is an enlarged cross-sectional view of a boundary between a main region 320 and a sense region 321 in FIG. 15(b).

In this manner, the semiconductor device 301 shown in FIG. 15 is obtained.

Third Embodiment

Figure 19:
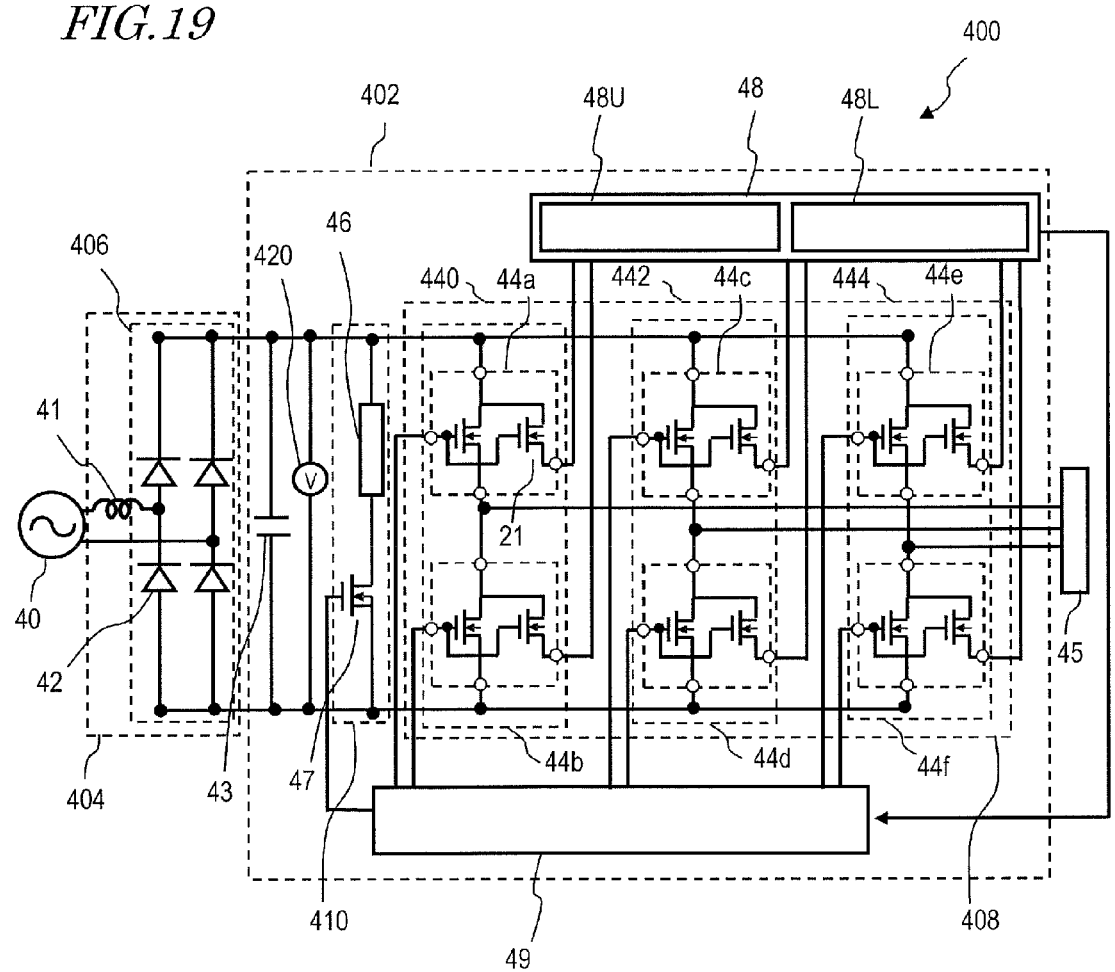
FIG. 19 A block diagram showing the construction of a load driving system including an inverter according to a third embodiment of the present disclosure.

Next, an inverter according to a third embodiment of the present disclosure will be described with reference to the drawings. FIG. 19 is a block diagram showing the construction of a load driving system 400 including an inverter 402 according to the present embodiment.

The load driving system 400 includes an AC power source 40, a rectification circuit 404, an inverter 402, and a load 45.

The rectification circuit 404 includes a diode bridge circuit 406, which is composed of four rectifier diodes 42, and a choke coil 41. An AC output voltage from the AC power source 40 is subjected to DC conversion through the rectifier diode 42. The choke coil 41 is inserted between the AC power source 40 and the diode bridge circuit 406 in order to improve the power factor.

The inverter 402 includes a three-phase bridge circuit 408, a regenerative power consuming circuit 410, a current-voltage converter 48, a gate voltage controller 49, a smoothing capacitor 43, and a voltage detector 420 which detects the voltage across the smoothing capacitor 43.

The three-phase bridge circuit 408 is composed of upper arms 44a, 44c, and 44e and lower arms 44b, 44d, and 44f, which are semiconductor devices according to the first embodiment or the second embodiment. The upper arm 44a and the lower arm 44b are in series connection with each other to compose a leg 440. Similarly, the upper arm 44c and the lower arm 44d are in series connection with each other to compose a leg 442. The upper arm 44e and the lower arm 44f are in series connection with each other to compose a leg 444. The midpoint of each leg 440, 442, 444 is connected to the load 45.

A DC voltage which has been smoothed by the smoothing capacitor 43 is applied to both ends of each leg 440, 442, 444 of the three-phase bridge circuit 408 to be converted into a three-phase current voltage by the three-phase bridge circuit 408. The three-phase current voltage which is output from the three-phase bridge circuit 408 is applied to the load 45.

The gate terminals of the semiconductor devices composing the upper arms 44a, 44c, and 44e and the lower arms 44b, 44d, and 44f of the respective legs 440, 442, and 444 are connected to the gate voltage controller 49, which provides gate voltage control.

The gate voltage controller 49 individually controls the gate voltages of the upper arms 44a, 44c, and 44e and the lower arms 44b, 44d, and 44f of the respective legs 440, 442, and 444 so that a sine-wave voltage of a desired frequency is supplied to the load 45. Moreover, the source terminal of the sense region 21 of each semiconductor device is connected to the current-voltage converter 48.

The current-voltage converter 48 is connected to the second source pad of each semiconductor device, and outputs voltage of a value that corresponds to the value of the current flowing between the drain pad and the second source pad.

The regenerative power consuming circuit 410 includes a resistor 46 for consuming, in the form of heat, a regenerative current which flows from the load 45 to the inverter 402, and a switching element 47 for controlling the regenerative current to be flowed to the resistor. The voltage detector 420 is in parallel connection with the smoothing capacitor 43, and is provided for detecting the regenerative current.

Based on the voltage which is output from the current-voltage converter 48 and the voltage which has been detected by the voltage detector 420, the gate voltage controller 49 controls the voltages to be applied to the gate pads of the semiconductor devices.

Figure 20:
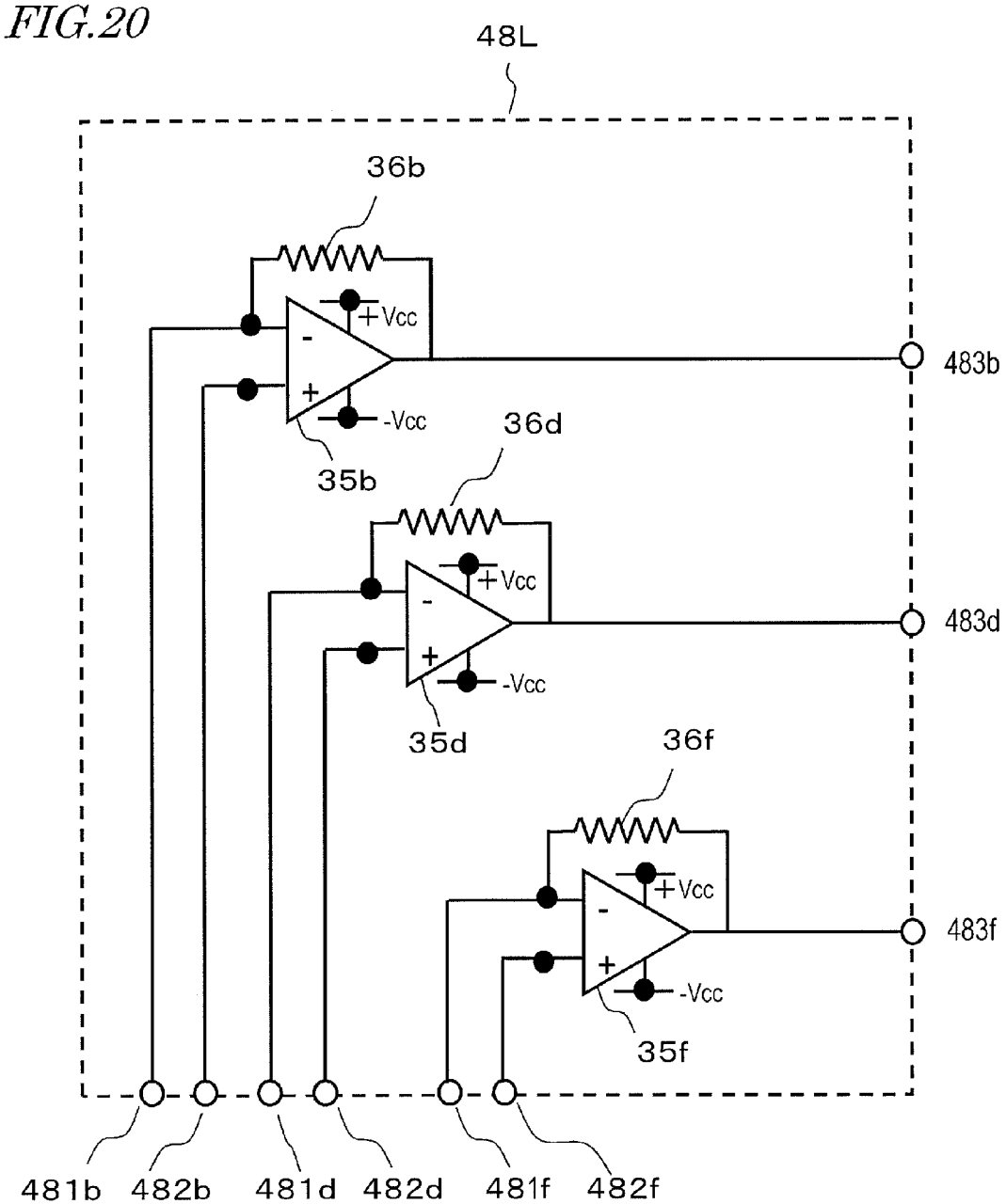
FIG. 20 A block diagram showing a current-voltage converter (for lower arms) according to the third embodiment of the present disclosure.
Figure 21:
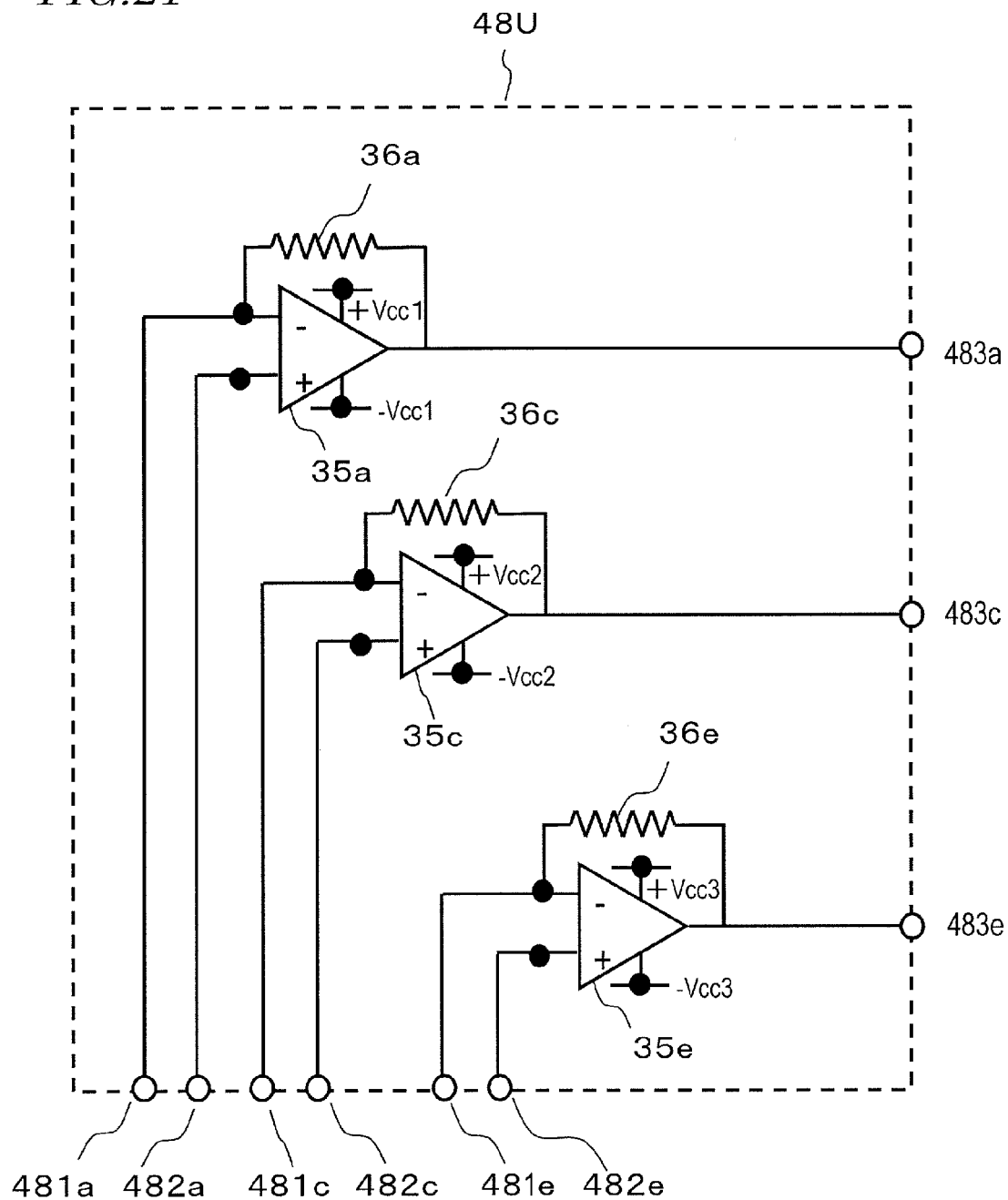
FIG. 21 A block diagram showing a current-voltage converter (for upper arms) according to the third embodiment of the present disclosure.

Hereinafter, the respective constituent elements will be described in detail. The current-voltage converter 48 includes current-voltage converters 48L and 48U. FIG. 20 and FIG. 21 are diagrams showing the details of the current-voltage converters 48L and 48U. FIG. 20 is a block diagram of the current-voltage converter 48L, which is connected to the lower arms 44b, 44d, and 44f. The current-voltage converter 48L is composed of three operational amplifiers 35b, 35d, and 35f that are connected to the lower arms 44b, 44d, and 44f, and their respective feedback resistors 36b, 36d, and 36f. A positive power voltage Vcc and a negative power voltage −Vcc are applied to each of the operational amplifiers 35b, 35d, and 35f. Their construction is identical to that of FIG. 13; the positive power voltage +Vcc which is supplied to the three operational amplifiers 35b, 35d, and 35f is an identical voltage, which may be supplied from the same positive supply.

The negative power voltage −Vcc which is supplied to the three operational amplifiers 35b, 35d, and 35f is an identical voltage, which may be supplied from the same negative supply. For example, the circuit which is connected to the lower arm 44b will be described. A terminal 481b which is provided at the inverting input of the operational amplifier 35b is connected to the source pad of the sense region of the lower-arm semiconductor device. A terminal 482b which is provided at the non-inverting input is connected to the Kelvin terminal which branches out from the source pad of the main region of the semiconductor device of the lower arm 44b. A terminal 483b which is provided at the output of the operational amplifier 35b is connected to the gate voltage controller 49. A sense resistor 36 is connected to the inverting input and the output of the operational amplifier 35b, so that a voltage which is obtained as a result of the feedback resistor 36b acting on the current flowing into 481b is output from the output terminal. The source pads of the main regions of the semiconductor devices of the lower arms are all connected to one electrode of the smoothing capacitor, and therefore at the same potential; thus, the reference potential for the power voltage to be fed to each operational amplifier may be the negative-side potential of the smoothing capacitor.

FIG. 21 is a block diagram of the current-voltage converter 48U for upper arms. It differs from the current-voltage converter 48L for lower arms in that the source potentials of the three semiconductor devices of the upper arms vary depending on the operating state, and may each take a different potential. Therefore, the power voltages to be supplied to the operational amplifiers 35a, 35c, and 35e, which are referenced against the source potentials of the semiconductor devices of the respective upper arms which are connected thereto, are different power voltages +Vcc1, −Vcc1, +Vcc2, −Vcc2, +Vcc3, and −Vcc3. Other aspects are the same as in the current-voltage converter 48L for lower arms.

Figure 22:
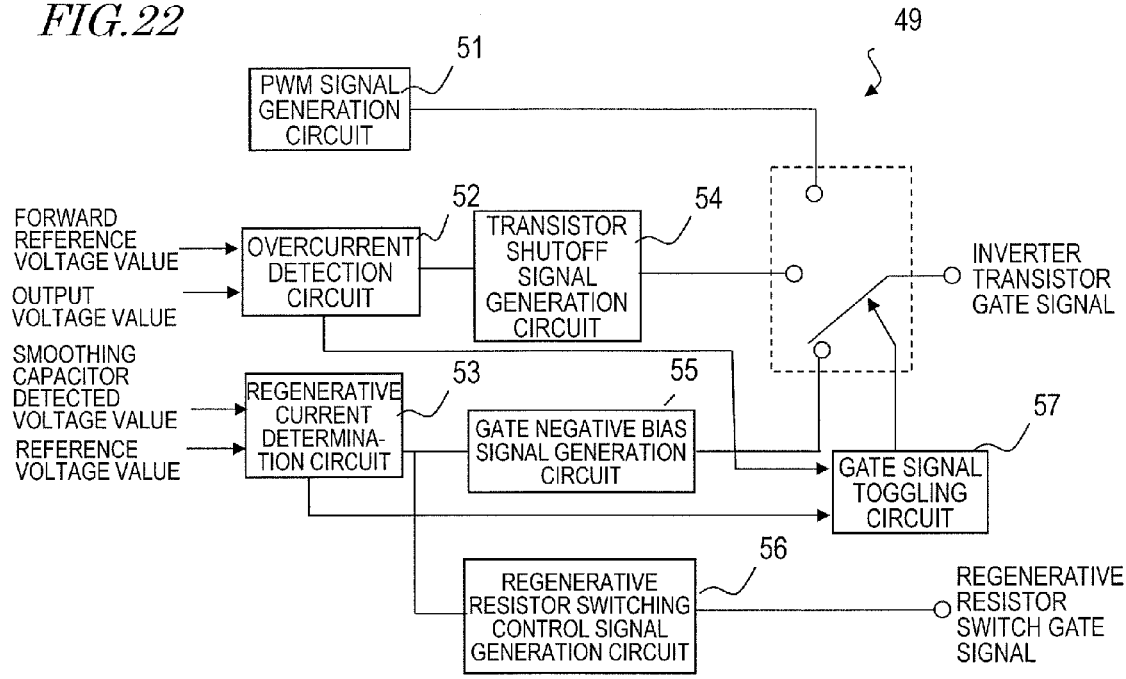
FIG. 22 A block diagram showing a gate control section according to the third embodiment of the present disclosure.

FIG. 22 is a functional block diagram showing the details of the gate voltage controller 49. The gate voltage controller 49 includes a PWM signal generation circuit 51, an overcurrent detection circuit 52, a regenerative current determination circuit 53, a transistor shutoff signal generation circuit 54, a gate negative bias signal generation circuit 55, a regenerative resistor switching control signal generation circuit 56, and a gate signal toggling circuit 57.

In a usual operating state, a signal which is generated by the PWM signal generation circuit 51 is output from the gate voltage controller 49 as a gate signal for each transistor of the legs 440, 442, and 444. As a result, a three-phase current voltage is applied to the load 45 (FIG. 19).

When the load 45 becomes short-circuited, or gate voltage control fails so that the upper arms 44a, 44c, and 44e become short-circuited with the lower arms 44b, 44d, and 44f, an overcurrent may flow in the semiconductor device(s), possibly destroying the semiconductor device(s). In order to prevent this, upon determining that an overcurrent has flowed in a semiconductor device, the gate voltage controller 49 stops the usual gate voltage control for that semiconductor device, and lowers the gate voltage so that the overcurrent flowing in the semiconductor device is cut off. Specifically, the overcurrent detection circuit 52 receives the signal which is output from the current-voltage converter 48, and compares it against a predetermined forward reference value. The signal which is output from the current-voltage converter 48 has a voltage value which is in proportion to the value of the current flowing between the drain pad and the second source pad. The current flowing between the drain pad and the second source pad, i.e., the current flowing in the sense region 21, is in proportion to the current flowing in the main region 20, which is the current flowing between the drain pad and the first source pad. Therefore, when the absolute value of the voltage which is output from the current-voltage converter 48 is greater than the predetermined forward reference value, it can be determined that an overcurrent is flowing to the load.

Once determining that an overcurrent is flowing to the load, the overcurrent detection circuit 52 outputs a signal to the transistor shutoff signal generation circuit 54 and the gate signal toggling circuit 57. Upon receiving the signal, the gate signal toggling circuit 57 selects the output from the transistor shutoff signal generation circuit 54, whereby the gate voltage controller 49 outputs a low gate voltage for shutting off the transistor, which has been generated by the transistor shutoff signal generation circuit 54. As a result, the transistor of the leg in which the overcurrent has been detected is shut off, thus restraining an overcurrent from flowing to the load 45.

Moreover, in the case where the load 45 is an inductive load, e.g., when operation of the semiconductor device is stopped after a state where a forward current was flowing, a back-induced electromotive force is generated so that a regenerative current, which is a reverse current, flows. This regenerative current flows in a path which, in this order from the load 45, connects the channel diode of the upper arm 44c of the leg 442, the smoothing capacitor 43, the channel diode of the lower arm 44b of the leg 440, and the load 45, for example.

Once a regenerative current flows, the voltage across the smoothing capacitor 43 increases. If the voltage across the smoothing capacitor 43 exceeds the breakdown voltage of the smoothing capacitor 43, the smoothing capacitor 43 may become destroyed. In order to prevent this, the regenerative current determination circuit 53 receives the detected voltage from the voltage detector 420, and compares the value of the detected voltage against a predetermined reference voltage value. If the value of the detected voltage exceeds the reference voltage value, the regenerative current determination circuit 53 determines that the voltage across the smoothing capacitor 43 has exceeded the reference voltage value.

In this case, the regenerative current determination circuit 53 outputs a signal to the regenerative resistor switching control signal generation circuit 56. Upon receiving the signal, the regenerative resistor switching control signal generation circuit 56 outputs a signal which causes the switching element 47, provided in the regenerative power consuming circuit 410, to conduct. As a result, the switching element 47 in the regenerative power consuming circuit 410 conducts, so that the regenerative current now flows through the resistor 46, whereby the regenerative power is converted into heat and consumed. This prevents the voltage across the smoothing capacitor 43, that is, the voltage of the primary power source, from becoming excessively high and destroying the smoothing capacitor 43 due to overvoltage.

Moreover, the regenerative current determination circuit 53 outputs a signal to the gate negative bias signal generation circuit 55 and the gate signal toggling circuit 57. Upon receiving the signal, the gate signal toggling circuit 57 selects the output from the gate negative bias signal generation circuit 55, whereby the gate voltage controller 49 outputs a negative gate voltage which has been generated by the gate negative bias signal generation circuit 55. As a result, the transistors which are the semiconductor devices of the legs 440, 442, and 444 have their resistance values in the reverse direction increased, so that more regenerative current is converted into heat and consumed also at the semiconductor devices of the legs 440, 442, and 444.

In the present embodiment, the gate voltage controller 49 includes both of the gate negative bias signal generation circuit 55 and the regenerative resistor switching control signal generation circuit 56, and upon determining that the regenerative current is equal to or greater than the predetermined value, operates both of the gate negative bias signal generation circuit 55 and the regenerative resistor switching control signal generation circuit 56. However, only one of them may be operated instead. Moreover, the gate voltage controller 49 does not even need to include the circuit that is not to be operated.

Figure 23A:
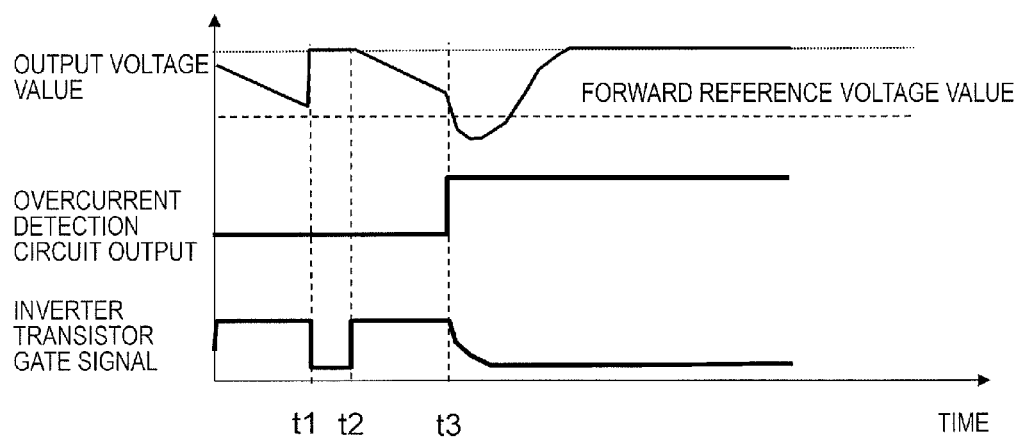
FIG. 23A A timing chart concerning a protection operation in the case where an overcurrent in the forward direction flows in a load driving system according to the third embodiment of the present disclosure.

FIG. 23A is a timing chart concerning a protection operation in the case where a forward overcurrent flows in a semiconductor device in the inverter of the present embodiment due to short-circuiting of the load or the like, showing gate signals and the like of a specific semiconductor device. From time 0 to t1, the gate is ON, and therefore the forward current that flows in the semiconductor device at issue keeps increasing during this period, whereby the output voltage value corresponding to the forward current decreases. From time t1 to t2, the gate is OFF, and therefore no current flows in the semiconductor device at issue, so that the output voltage value does not change. The gate turns ON again at time t2; if an accident such as short-circuiting of the load causes a rapid increase in the current and decreases the output voltage value, until going beyond a previously-set forward reference voltage value at time t3, the output of the overcurrent detection circuit 52 becomes ON, so that a gate signal which will cut off the current in the semiconductor device is output. Since instantaneously turning the gate OFF will result in a back electromotive force of an inductive load, it is preferable to turn OFF the gate gradually. In this manner, the forward current of the semiconductor device is reduced to zero.

Figure 23B:
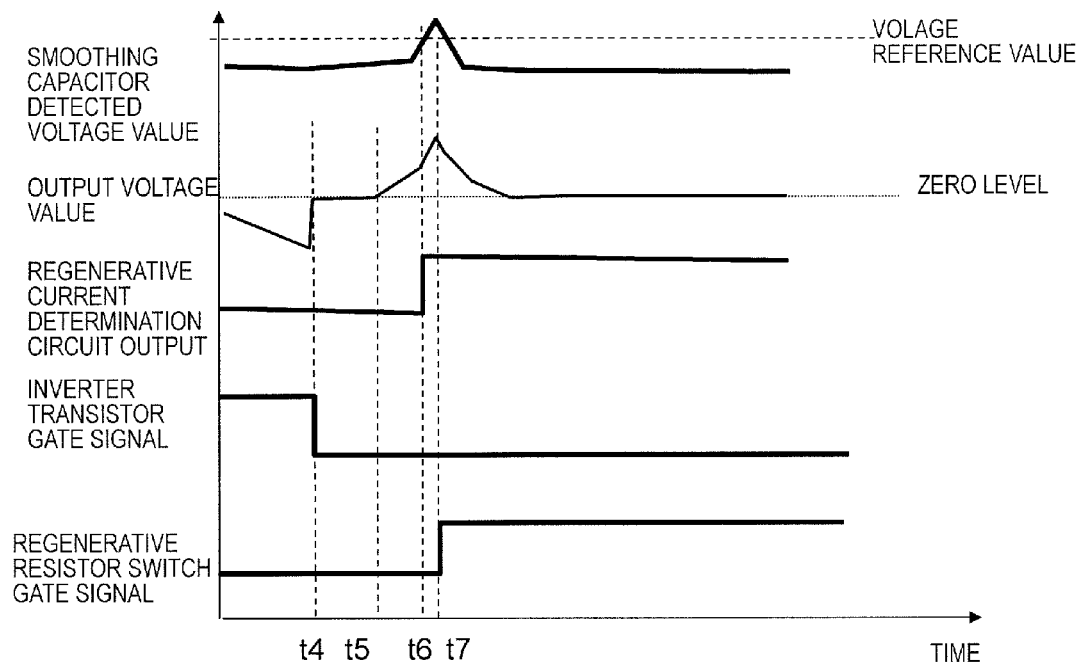
FIG. 23B A timing chart concerning a protection operation in the case where an overcurrent in the reverse direction flows in a load driving system according to the third embodiment of the present disclosure.

FIG. 23B is a timing chart concerning a protection operation in the case where, due to slowing down of a motor, a regenerative current is flowing from the motor into the smoothing capacitor. At time t4, the gate signal becomes OFF, so that the current once equals zero; however, at time t5, a reverse current which is presumably a regenerative current begins to flow. The smoothing capacitor is charged with this reverse current, whereby the voltage value across its both ends increases. At time t6, the voltage across the smoothing capacitor exceeds a reference voltage value which is previously set, whereupon the output of the regenerative current determination circuit 53 becomes ON, thus turning the regenerative resistor switch gate signal ON at time t7. The regenerative current flows to the regenerative resistor, where it turns into heat so that the regenerative energy is consumed. As a result, the regenerative current is reduced to zero, thereby eliminating the overvoltage of the smoothing capacitor.

Figure 23C:
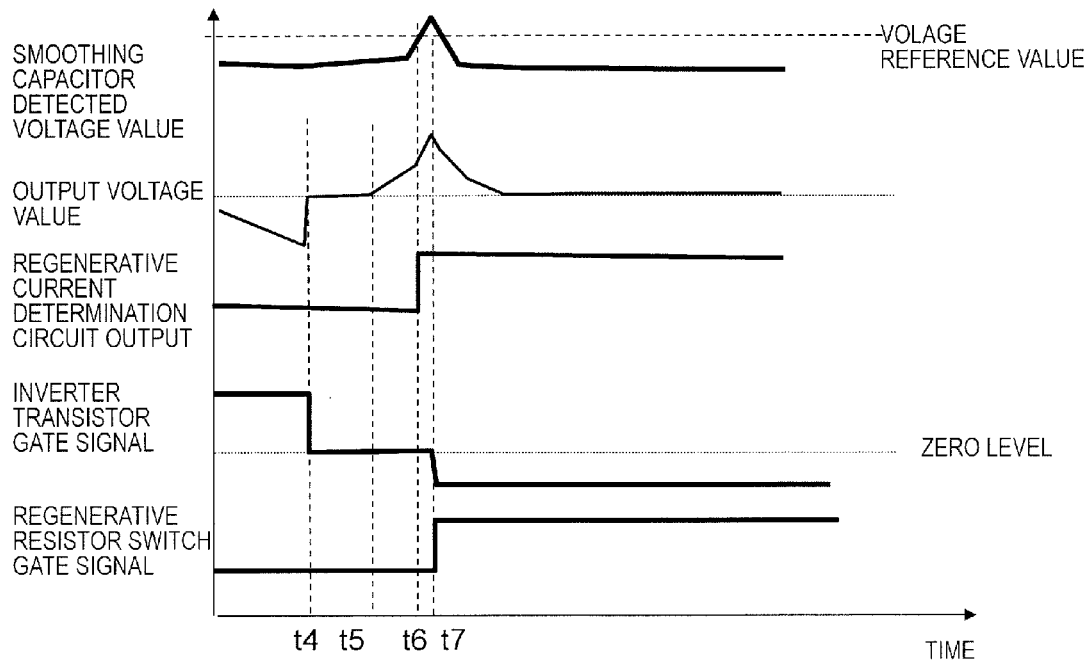
FIG. 23C A timing chart concerning a protection operation in the case where a load driving system according to the third embodiment of the present disclosure is allowed to consume regenerative energy in a regenerative resistor and the semiconductor device of the inverter.

FIG. 23C is a time chart showing a protection operation where regenerative energy is consumed not only in the regenerative resistor but also in the semiconductor device of the inverter. When the output of the regenerative current determination circuit 53 becomes ON at time t6, not only the regenerative resistor switch gate signal becomes ON, but also the gate voltage of that semiconductor device is changed from zero to negative. The negative gate voltage is −5 V, for example. As the gate voltage becomes negative, the channel diode increases in resistance. The regenerative energy is consumed by the resistances of the regenerative resistor and the channel diode. As a result, the regenerative current is reduced to zero, thereby eliminating the overvoltage of the smoothing capacitor.

As shown in FIG. 14, in the semiconductor device which is disclosed in the present specification, the resistance of the channel diode of the semiconductor device can be changed by shifting the gate voltage toward the negative side. This increases the conduction loss at the channel diode of the semiconductor device, thus allowing regenerative power to be consumed also at the channel diode. In the case of a semiconductor device in which silicon is used, the temperature of the semiconductor device will increase due to the heat when regenerative power is consumed, so that the absolute maximum rated temperature may be exceeded and operation may be disabled. In contrast, the semiconductor device which is disclosed in the present specification utilizes silicon carbide, which has excellent thermal resistance, and therefore restrains the semiconductor device from becoming unable to operate due to the heat when regenerative power is consumed.

Figure 24:
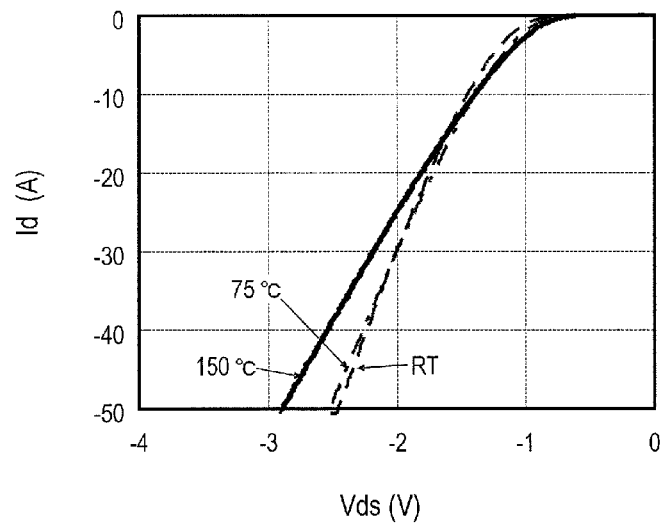
FIG. 24 A graph showing the temperature characteristics of an IV curve of a semiconductor device according to the third embodiment of the present disclosure, in the reverse direction.

FIG. 24 is a graph showing the temperature characteristics of an IV curve of the semiconductor device which is disclosed in the present specification in the reverse direction. In FIG. 24, the horizontal axis represents the drain-source voltage Vds, and the vertical axis represents the drain current in the reverse direction. Data indicated by the broken line represents measurement results at room temperature; data indicated by the dot-dash line represents measurement results at 75° C.; and data indicated by the solid line represents measurement results at 150° C. It can be seen from FIG. 24 that the semiconductor device which is disclosed in the present specification is operating as a diode even at a high temperature of 150° C.

Thus, by shifting the gate voltage of the semiconductor device toward the negative side so as to allow regenerative power to be consumed at the channel diode, the power which is consumed by the resistor 46 in the regenerative power consuming circuit 410 decreases, thus making it possible to downsize the resistor 46 and the heat radiation mechanism which is provided in the resistor 46.

Fourth Embodiment

Next, an inverter according to a fourth embodiment of the present disclosure will be described with reference to the drawings. The inverter of the present embodiment differs from the third embodiment in that it detects a regenerative current based not on the voltage across the smoothing capacitor but on a reverse current which flows in a semiconductor device.

Figure 25:
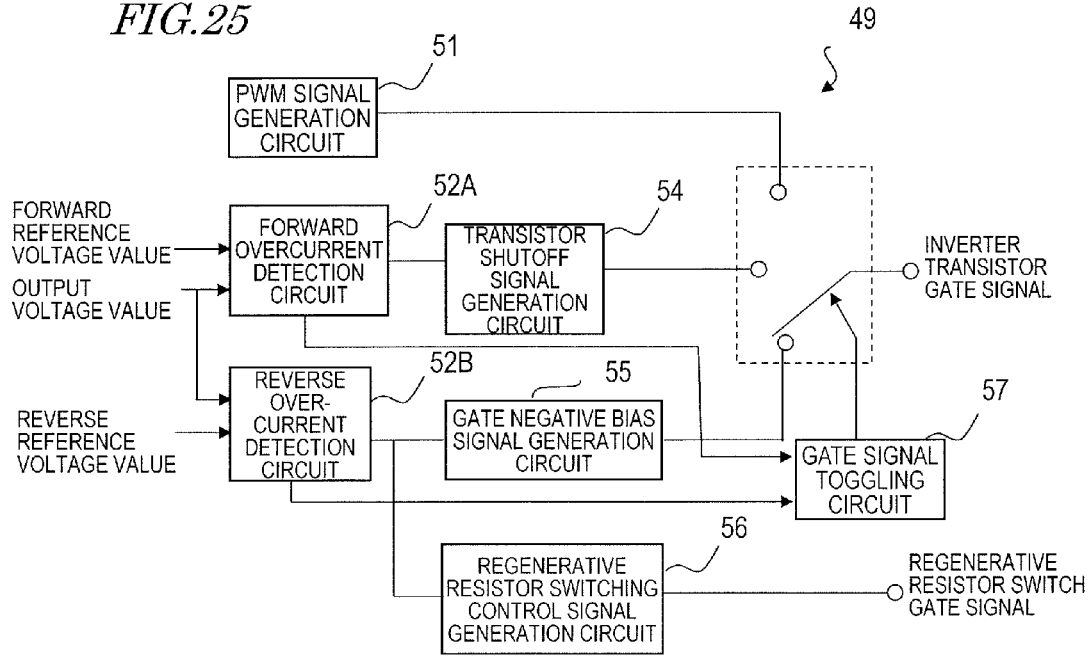
FIG. 25 A block diagram showing a gate control section according to a fourth embodiment of the present disclosure.

FIG. 25 is a functional block diagram showing a gate voltage controller 49 according to the present embodiment. The gate voltage controller 49 includes a forward overcurrent detection circuit 52A and a reverse overcurrent detection circuit 52B. In a usual operating state, the output of the PWM signal generation circuit is output as a gate signal for the transistors of the inverter.

the output of the current-voltage converter 48, i.e., voltage of a value corresponding to the value of the current flowing between the drain pad and the second source pad, is input to the gate voltage controller 49. The output voltage from the current-voltage converter 48 is input to both the forward overcurrent detection circuit 52A and the reverse overcurrent detection circuit 52B.

The forward overcurrent detection circuit 52A compares a previously-set forward reference voltage value and the value of the output voltage of the current-voltage converter 48, and if the absolute value of the output voltage of the current-voltage converter 48 is greater than the forward reference voltage value, determines an overcurrent in the forward direction. In this case, the forward overcurrent detection circuit 52A outputs a signal to the transistor shutoff signal generation circuit 54 and the gate signal toggling circuit 57. Upon receiving the signal, the gate signal toggling circuit 57 selects the output from the transistor shutoff signal generation circuit 54, whereby the gate voltage controller 49 outputs a low gate voltage which has been generated by the transistor shutoff signal generation circuit 54 to shut off the transistors. As a result, the transistors in the leg in which an overcurrent has been detected are shut off, thus restraining an overcurrent from flowing to the load 45.

The reverse overcurrent detection circuit 52B compares a previously-set reverse reference voltage value and the value of the output voltage of the current-voltage converter 48, and if the absolute value of the output voltage of the current-voltage converter 48 is greater than the reverse reference voltage value, determines that a regenerative current is occurring. In this case, as in the third embodiment, the reverse overcurrent detection circuit 52B outputs a signal to the regenerative resistor switching control signal generation circuit 56. Upon receiving the signal, the regenerative resistor switching control signal generation circuit 56 outputs a signal which causes the switching element 47 provided in the regenerative power consuming circuit 410 to conduct.

Moreover, the reverse overcurrent detection circuit 52B outputs a signal to the gate negative bias signal generation circuit 55 and the gate signal toggling circuit 57. Upon receiving the signal, the gate signal toggling circuit 57 selects the output from the gate negative bias signal generation circuit 55, whereby the gate voltage controller 49 outputs a negative gate voltage which has been generated by the gate negative bias signal generation circuit 55. As a result, the transistors which are the semiconductor devices of the legs 440, 442, and 444 have their resistance values in the reverse direction increased, so that more regenerative current is converted into heat and consumed also at the semiconductor devices of the legs 440, 442, and 444.

In the present embodiment, the gate voltage controller 49 includes both of the gate negative bias signal generation circuit 55 and the regenerative resistor switching control signal generation circuit 56, and upon determining that the regenerative current is equal to or greater than the predetermined value based on the value of the output voltage of the current-voltage converter 48, operates both of the gate negative bias signal generation circuit 55 and the regenerative resistor switching control signal generation circuit 56. However, only one of them may be operated instead. Moreover, the gate voltage controller 49 does not even need to include the circuit that is not to be operated.

Figure 26:
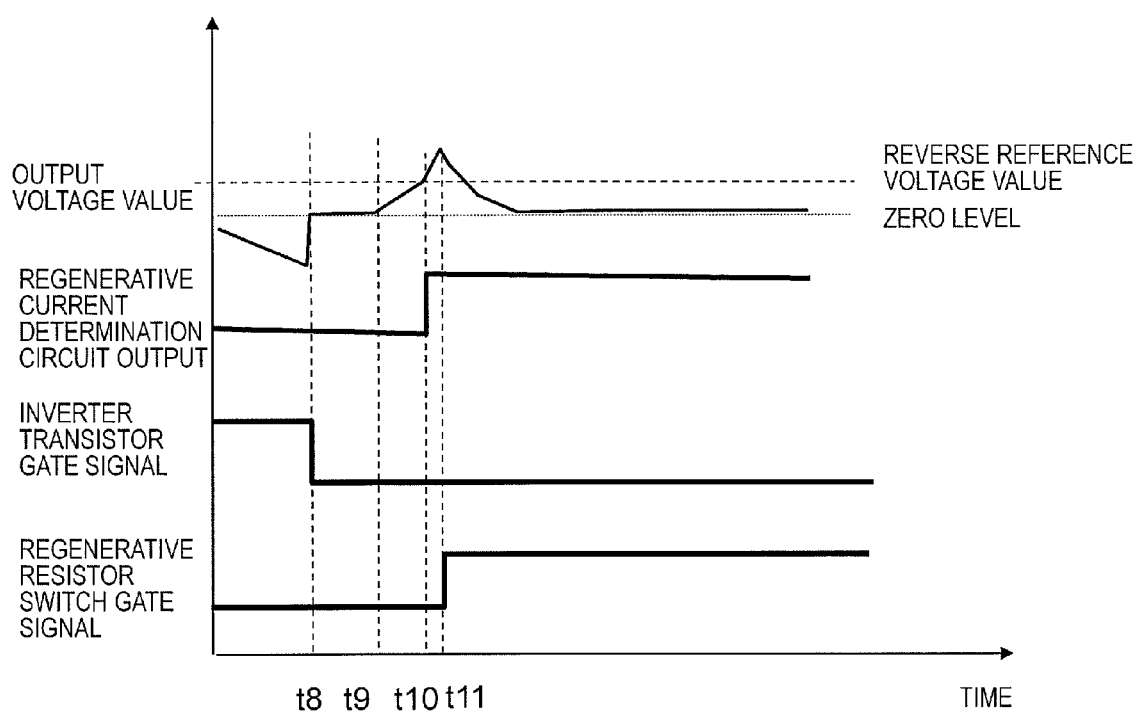
FIG. 26 A timing chart concerning a protection operation in the case where an overcurrent in the reverse direction flows in a load driving system according to the fourth embodiment of the present disclosure.

FIG. 26 is a time chart showing a protection operation when an overcurrent is flowing in the reverse direction in the inverter of the present embodiment. From time 0 to t8, the gate of the semiconductor device is ON, and therefore a forward current is flowing. At time t8, the gate signal becomes OFF, so that the current flowing in the semiconductor device once equals zero, but a reverse current begins to flow from time t9 (the output voltage of the current-voltage converter 48 takes negative values). When the output voltage value exceeds a previously-set reverse reference voltage value at time t10, the reverse overcurrent detection circuit is turned ON, thus turning the gate of the switching element 47 for the regenerative resistor ON. The regenerative current flows through the resistor 46, and regenerative energy is consumed in the regenerative resistor, so that the current gradually decreases and it no longer flows.

When a motor as the load 45 is forcibly driven in the reverse rotation direction, an overcurrent in the reverse direction may flow in the inverter 402. when an overcurrent in the reverse direction flows, the voltage across the smoothing capacitor 43 may rapidly increase, possibly destroying the smoothing capacitor 43. According to the present embodiment, when an overcurrent in the reverse direction is detected, the regenerative power is converted into heat by the resistance of the resistor 46 or the channel diode and consumed. As a result, the voltage of the smoothing capacitor 43, that is, the voltage of the primary power source, never becomes excessively high, thereby preventing the smoothing capacitor 43 from being destroyed due to overvoltage.

Comparative Example

Figure 27:
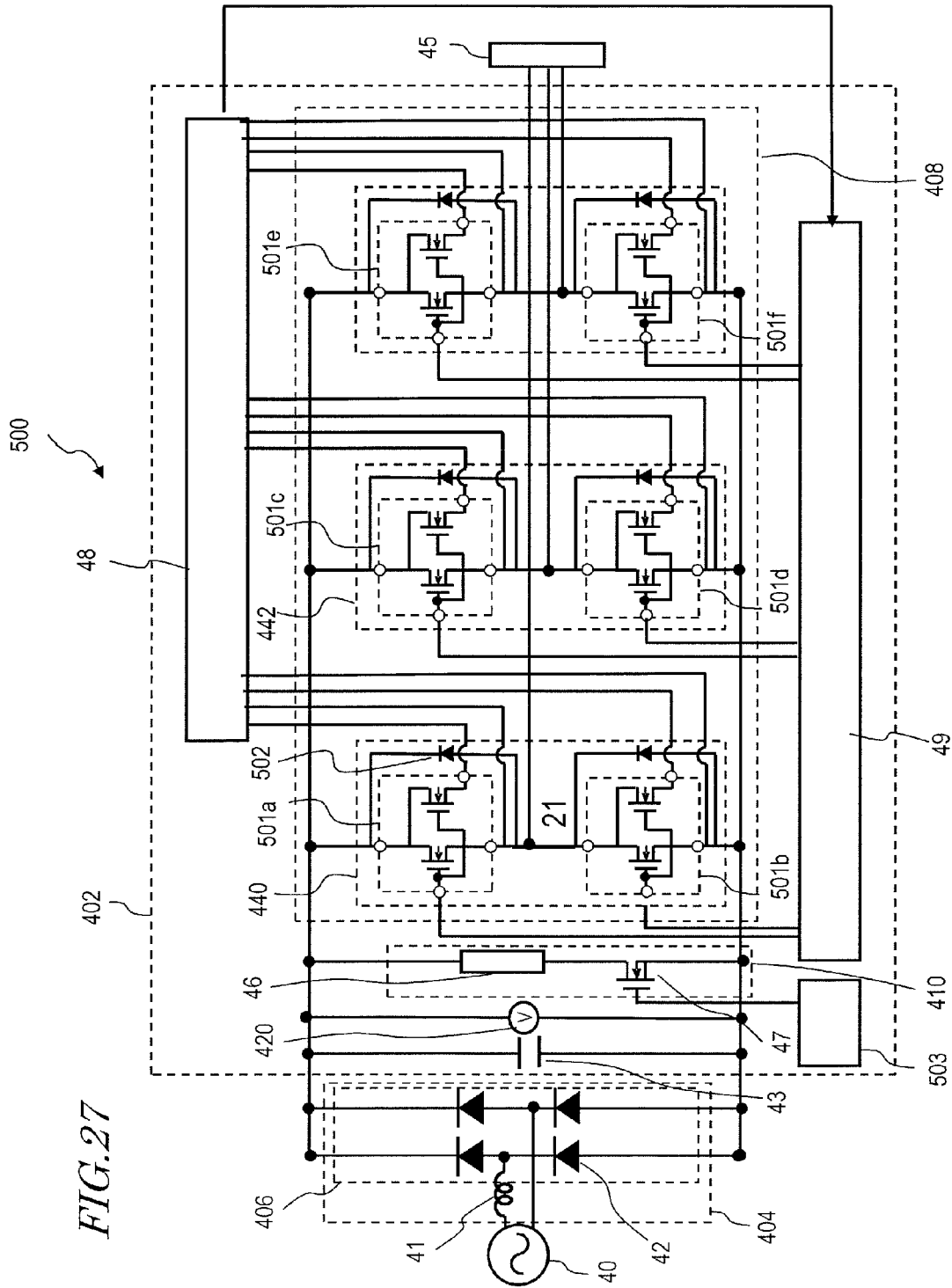
FIG. 27 A block diagram showing the construction of a load driving system including an inverter of Comparative Example.

FIG. 27 shows a block diagram of an inverter in which conventional semiconductor devices 501a to 501f with a current detection function are used, where the semiconductor devices 501a to 501f do not possess a channel diode function. Since there is no channel diode, an external free-wheel diode 502 needs to be employed in antiparallel connection with the semiconductor device of each arm. The conventional semiconductor device 501 with a current detection function is able to detect a forward current, but cannot detect a reverse current which flows in the external free-wheel diode. Therefore, direct detection of a regenerative current is not possible in the manner of the fourth embodiment of the present disclosure, and the determination that a regenerative current is flowing cannot be made unless the voltage across the smoothing capacitor is detected by the voltage detector 420 or a current detector for the external free-wheel diode is separately provided.

On the other hand, the semiconductor device according to the present disclosure, without the need to provide an external free-wheel diode, the reverse current flows also in the channel of the same semiconductor device, and the forward current flowing in the main region and the reverse current can both be indirectly detected from a small current which flows in the sense region.

Although the above embodiments illustrate examples where the first conductivity type is the n type and the second conductivity type is the p type, this is not a limitation. The first conductivity type may be the p type, and the second conductivity type may be the n type.

INDUSTRIAL APPLICABILITY

The technique disclosed in the present specification is useful in semiconductor device applications for use in power converters, for example. In particular, it is useful in power semiconductor device applications, for mounting on a power converter that is for onboard use or for use in industrial equipment or the like.

REFERENCE SIGNS LIST 1, 301 semiconductor device
2 main region source pad
3 sense region source pad
4 gate pad
5 semiconductor substrate
6 first silicon carbide semiconductor layer
7 body region (well region)
8 source region
9 contact region
10 source electrode
11 second silicon carbide semiconductor layer
12 gate insulating film
13 gate electrode
14 interlevel dielectric film
15 upper interconnect
16 drain electrode
17 back side electrode
18, 19 edge termination base region
20, 320 main region
21, 321 sense region
22 Vcc power
23 gate driver
24 gate driver power
25 pulse signal generator
26 gate resistor
27 high current probe
28 low current probe
29 voltmeter
30 switching FET
31 Vdd power line
32 return line
33 main region
34 sense region
35 operational amplifier
36 sense resistor
37, 45 load
40 AC power source
41 choke coil
42 rectifier diode
43 smoothing capacitor
44a, 44c, 44e upper arm
44b, 44d, 44f lower arm
46 resistor
47 switching element
48 current-voltage converter
48U current-voltage converter (for upper arms)
48L current-voltage converter (for lower arms)
49 gate voltage controller
70, 90, 200 measurement system
72 substrate
74, 204 drain terminal
76, 206 gate terminal
78, 208 main region source terminal
79, 209 sense region source terminal
80, 210 Kelvin terminal
110 element isolation region
111, 311 unit cell
112 trench
113 polycrystalline silicon film
114 via hole
400, 500 load driving system
402 inverter
404 rectification circuit
406 diode bridge circuit
408 three-phase bridge circuit
410 regenerative power consuming circuit
420 voltage detector
440, 442, 444 leg
501a, 501b, 501c, 501d, 501e, 501f conventional semiconductor element with a current detection function
502 external free-wheel diode

The invention claimed is:

1. A semiconductor device comprising:
a semiconductor substrate of a first conductivity type, including a main region and a sense region;
unit cells provided in the main region and in the sense region of the semiconductor substrate of the first conductivity type, each of the unit cells having a metal-insulator-semiconductor field effect transistor, the number of the unit cells in the sense region being smaller than the number of the unit cells in the main region, the metal-insulator-semiconductor field effect transistors being connected in parallel connection in each of the main region and the sense region;
a gate pad on a principal face side of the semiconductor substrate; a first source pad and second source pad insulated from each other; and a drain pad on a back side of the semiconductor substrate, each metal-insulator-semiconductor field effect transistor including a first silicon carbide semiconductor layer of the first conductivity type located on the principal face of the semiconductor substrate,
a body region of a second conductivity type in contact with the first silicon carbide semiconductor layer,
a source region of the first conductivity type in contact with the body region, a second silicon carbide semiconductor layer on the first silicon carbide semiconductor layer and in contact with at least a portion of the body region and at least a portion of the source region,
a gate insulating film on the second silicon carbide semiconductor layer, a gate electrode on the gate insulating film, a source electrode in contact with the source region, and a drain electrode on the back side of the semiconductor substrate, wherein: given that Vds is a potential of the drain electrode relative to a potential of the source electrode,
Vgs is a potential of the gate electrode relative to the potential of the source electrode, and
Vth is a gate threshold voltage of the metal-insulator-semiconductor field effect transistor, when Vds is positive, the metal-insulator-semiconductor field effect transistor allows a current to flow from the drain electrode to the source electrode if Vgs is equal to or greater than Vth, when Vds is negative, the metal-insulator-semiconductor field effect transistor functions as a diode to allow a current to flow from the source electrode to the drain electrode if Vas is less than Vth;

an absolute value of an onset voltage of the diode is smaller than an absolute value of an onset voltage of a body diode which is constituted by the body region and the first silicon carbide semiconductor layer;

the gate electrode of each of the unit cells in the main region and the gate electrode of each of the unit cells in the sense region are electrically connected to the gate pad;

the drain electrode of each of the unit cells in the main region and the drain electrode of each of the unit cells in the sense region are electrically connected to the drain pad;

the source electrode of each of the unit cells in the main region is electrically connected to the first source pad;

the source electrode of each of the unit cells in the sense region is electrically connected to the second source pad; and at least a part of the second silicon carbide semiconductor layer comprises a first layer of the first conductivity type.

2. The semiconductor device of claim 1, wherein, at least a region of the body region that is in contact with the second silicon carbide semiconductor layer has an impurity concentration of $1 \times 10^{18}$ cm$^{-3}$ or more;

the first layer second silicon carbide semiconductor layer has an impurity concentration of not less than $1 \times 10^{17}$ cm$^{-3}$ and not more than $4 \times 10^{18}$ cm$^{-3}$; and the second silicon carbide semiconductor layer has a thickness of not less than 20 nm and not more than 70 nm.

3. The semiconductor device of claim 1, further comprising:

the first silicon carbide semiconductor layer of the first conductivity type at a boundary between the main region and the sense region, the first silicon carbide semiconductor layer being on the semiconductor substrate; and an element isolation region of the second conductivity type in the first silicon carbide semiconductor layer, wherein no second silicon carbide semiconductor layer is provided over the element isolation region.

4. The semiconductor device of claim 1, further comprising a trench penetrating through the body region and the source region and reaching the first silicon carbide semiconductor layer.

5. The semiconductor device of claim 1, wherein a current to flow in the sense region is 100 mA or less.

6. An inverter comprising:

a leg composed of an upper arm and a lower arm, at least one of the upper arm and the lower arm being the semiconductor device of claim 1;

a current-voltage converter being connected to the second source pad of the semiconductor device, the current-voltage converter adapted to output a voltage of a value corresponding to the value of a current flowing between the drain pad and the second source pad; and a gate voltage controller adapted to control a voltage to be applied to the gate pad of the semiconductor device based on the voltage output from the current-voltage converter.

7. The inverter of claim 6, wherein the current-voltage converter includes:

an operational amplifier including an inverting input terminal, a non-inverting input terminal, and an output terminal; and a resistor connecting the inverting input terminal and the output terminal.

8. The inverter of claim 7, wherein the operational amplifier is of a dual supply type.

9. The inverter of claim 6, further comprising:

a smoothing capacitor in parallel connection with the leg;

a voltage detector adapted to detect a voltage across the smoothing capacitor; and a regenerative power consuming circuit including a resistor to consume a regenerative current flowing from a load to the inverter as heat and a switching element to control the regenerative current to be flowed to the resistor, wherein the gate voltage controller is adapted to compare the voltage across the smoothing capacitor as detected by the voltage detector against a reference voltage value, and if the voltage across the smoothing capacitor exceeds the reference voltage value, controls the switching element to flow the regenerative current to the resistor.

10. The inverter of claim 6, further comprising:

a smoothing capacitor in parallel connection with the leg; and a voltage detector for detecting a voltage across the smoothing capacitor, wherein the gate voltage controller is adapted to compare the voltage across the smoothing capacitor as detected by the voltage detector against a reference voltage value, and if the voltage across the smoothing capacitor exceeds the reference voltage value, ensures that a negative voltage is applied to the gate pad.

11. The inverter of claim 6, further comprising:

a smoothing capacitor in parallel connection with the leg; and a regenerative power consuming circuit including a resistor to consume a regenerative current flowing from a load to the inverter as heat and a switching element to control the regenerative current to be flowed to the resistor, wherein the gate voltage controller is adapted to compare the value of the output voltage output from the current-voltage converter against a reverse reference voltage value, and if an absolute value of the output voltage exceeds the reverse reference voltage value, controls operation of the switching element so that the regenerative current flows to the resistor.

12. The inverter of claim 6, further comprising a smoothing capacitor in parallel connection with the leg, wherein the gate voltage controller is adapted to compare the value of the output voltage output from the current-voltage converter against a reverse reference voltage value, and if an absolute value of the output voltage exceeds the reverse reference voltage value, ensures that a negative voltage is applied to the gate pad.

13. A method of controlling an inverter including a leg composed of an upper arm and a lower arm, at least one of the upper arm and the lower arm being the semiconductor device of claim 1, and a smoothing capacitor in parallel connection with the leg, the method comprising:

detecting a voltage across the smoothing capacitor; and comparing the voltage across the smoothing capacitor against a reference voltage value, and if the voltage across the smoothing capacitor exceeds the reference voltage value, ensuring that a negative voltage is applied to the gate pad.

14. A method of controlling an inverter including a leg composed of an upper arm and a lower arm, at least one of the upper arm and the lower arm being the semiconductor device of claim 1, a smoothing capacitor in parallel connection with the leg, a current-voltage converter being connected between the semiconductor device and the second source pad and outputting a voltage of a value corresponding to the value of a current flowing between the drain pad and the second source pad, and a regenerative power consuming circuit including a resistor to consume a regenerative current flowing from a load to the inverter as heat and a switching element to control the regenerative current to be flowed to the resistor, the method comprising:

detecting the value of the output voltage output from the current-voltage converter; and comparing the value of the output voltage output from the current-voltage converter against a reverse reference voltage value, and if an absolute value of the output voltage exceeds the reverse reference voltage value, operating the switching element so that the regenerative current flows to the resistor.

15. A method of controlling an inverter including a leg composed of an upper arm and a lower arm, at least one of the upper arm and the lower arm being the semiconductor device of claim 1, a smoothing capacitor in parallel connection with the leg, and a current-voltage converter being connected to the second source pad of the semiconductor device and outputting a voltage of a value corresponding to the value of a current flowing between the drain pad and the second source pad, the method comprising:

detecting the value of the output voltage output from the current-voltage converter; and comparing the value of the output voltage output from the current-voltage converter against a reverse reference voltage value, and if an absolute value of the output voltage exceeds the reverse reference voltage value, ensures that a negative voltage is applied to the gate pad.

16. The semiconductor device of claim 1, wherein the second silicon carbide semiconductor layer includes the undoped layer.

17. The semiconductor device of claim 1, wherein the second layer is disposed on the first layer.

18. The semiconductor device of claim 1, wherein the first layer is disposed on the second layer.

19. The semiconductor device of claim 1, wherein:

the second silicon carbide semiconductor layer further includes a third layer selected from a group consisting of an undoped layer and a layer of the first conductivity type having an impurity concentration of less than $1 \times 10^{17}$ cm$^{-3}$; and the first layer is disposed between the second layer and the third layer.

* * * * *